(12) United States Patent
Waki

(10) Patent No.: US 10,886,939 B2
(45) Date of Patent: Jan. 5, 2021

(54) SAMPLE-HOLD CIRCUIT AND AD CONVERTER

(71) Applicants: Kabushiki Kaisha Toshiba, Tokyo (JP); Toshiba Electronic Devices & Storage Corporation, Tokyo (JP)

(72) Inventor: Naoya Waki, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/570,379

(22) Filed: Sep. 13, 2019

(65) Prior Publication Data
US 2020/0304140 A1   Sep. 24, 2020

(30) Foreign Application Priority Data
Mar. 19, 2019   (JP) .................................. 2019-050984

(51) Int. Cl.
*H03M 1/00*   (2006.01)
*H03M 3/00*   (2006.01)

(52) U.S. Cl.
CPC .................................. *H03M 3/496* (2013.01)

(58) Field of Classification Search
CPC .................................................... H03M 3/496
USPC ................................................. 341/122, 155
See application file for complete search history.

(56) References Cited

U.S. PATENT DOCUMENTS

| 7,427,880 B2 | 9/2008 | Takahashi et al. |
| 2005/0156654 A1* | 7/2005 | Gaggl .................. H03H 19/004 327/337 |
| 2018/0306845 A1* | 10/2018 | Yamaguchi ...... G01R 19/16576 |
| 2020/0083901 A1* | 3/2020 | Adusumalli ........ H03F 3/45928 |

FOREIGN PATENT DOCUMENTS

| JP | H07-262785 A | 10/1995 |
| JP | H07-262789 A | 10/1995 |
| JP | 2727962 B2 | 12/1997 |
| JP | 2005-252703 A | 9/2005 |
| JP | 2006-50193 A | 6/2006 |
| JP | 4536452 B2 | 6/2010 |

OTHER PUBLICATIONS

J. Markus, "Theory and Applications of Incremental D S Converters", IEEE Transaction on Circuits and systems I, vol. 51, No. 4, pp. 678-690, Apr. 2004.

* cited by examiner

*Primary Examiner* — Peguy Jean Pierre
(74) *Attorney, Agent, or Firm* — White & Case LLP

(57) ABSTRACT

According to an embodiment, a sample-hold circuit according to this embodiment is made up of a first device having a first withstand voltage and a second device having a second withstand voltage lower than the first withstand voltage. The sample-hold circuit includes a first switch element, a first capacitor, a second switch element, a third switch element, and a fourth switch element. The first switch element has the first withstand voltage. The first switch element operates upon receiving a first signal output from the device having the first withstand voltage. The second switch element has the first withstand voltage. The third switch element has the second withstand voltage. The fourth switch element has the second withstand voltage.

11 Claims, 15 Drawing Sheets

SAMPLE-HOLD CIRCUIT AND AD CONVERTER

CROSS-REFERENCE TO RELATED APPLICATIONS

This application is based upon and claims the benefit of priority from Japanese Patent Application No. 2019-050984, filed on Mar. 19, 2019; the entire contents of which are incorporated herein by reference.

FIELD

Embodiments disclosed herein relate to a sample-hold circuit and an AD converter.

BACKGROUND

An AD converter samples an input signal with a sample-hold circuit, holds the input signal for a fixed period, and converts the input signal into a discrete signal. In order to satisfy a withstand voltage, the sample-hold circuit is generally made up of a device having an electric withstand voltage equivalent to an input range of the input signal.

DETAILED DESCRIPTION

Figure 1:
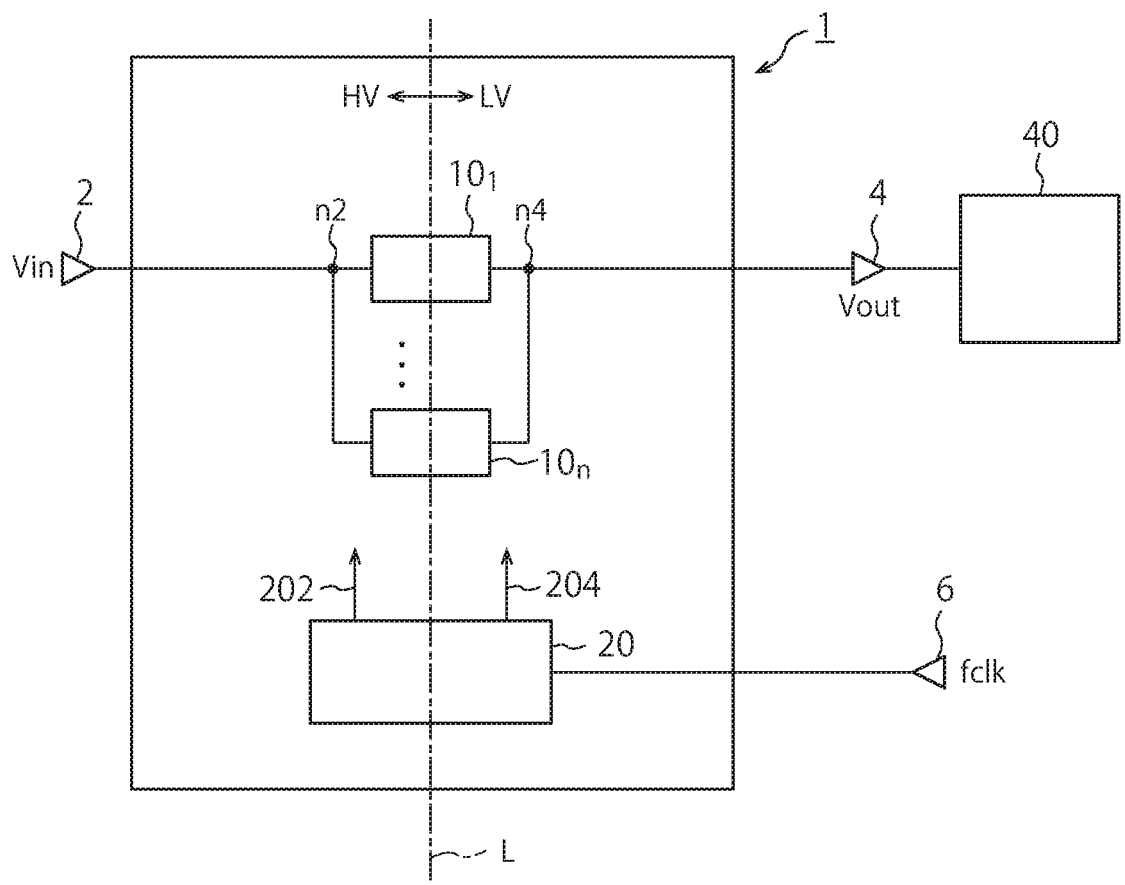
FIG. 1 is a block diagram showing an entire configuration of a sample-hold circuit according to a first embodiment.

According to an embodiment, a sample-hold circuit according to this embodiment is made up of a first device having a first withstand voltage and a second device having a second withstand voltage lower than the first withstand voltage. The sample-hold circuit includes a first switch element, a first capacitor, a second switch element, a third switch element, and a fourth switch element. The first switch element has the first withstand voltage.

One end of the first switch element is connected to an input terminal. The first switch element operates according to a first signal output from the first device. The first capacitor is a capacitor for sample and hold, one end of which is connected to the other end of the first switch element. The second switch element has the first withstand voltage.

One end of the second switch element is connected to the one end of the first capacitor. The other end of the second switch element is connected to a common mode voltage on the first withstand voltage side. The second switch element operates upon receiving a second signal output from the first device. The third switch element has the second withstand voltage.

One end of the third switch element is connected to the other end of the first capacitor. The other end of the third switch element is connected to a common mode voltage on the second withstand voltage side. The third switch element operates upon receiving a third signal output from the second device. The fourth switch element has the second withstand voltage.

One end of the fourth switch element is connected to the other end of the first capacitor. The other end of the fourth switch element is connected to an output terminal. The fourth switch element operates according to a fourth signal output from the second device.

Sample-hold circuits and AD converters according to embodiments of the present invention are explained in detail below with reference to the drawings. The embodiments explained below are examples of the embodiments of the present invention. The present invention are not interpreted to be limited to these embodiments. In the drawings referred to in the embodiments, the same portions or portions having the same functions are denoted by the same or similar reference numerals and signs. Repeated explanation of the portions is sometimes omitted. For convenience of explanation, dimension ratios of the drawings are sometimes different from actual ratios. A part of components is sometimes omitted from the drawings.

First Embodiment

FIG. 1 is a block diagram showing an entire configuration of a sample-hold circuit 1 according to a first embodiment. The sample-hold circuit 1 includes a first device which is sometimes called "a high-withstand voltage device" here having a first withstand voltage (HV) and a second device which is sometimes called "a low-withstand voltage device" here having a second withstand voltage (LV) that is lower than the first withstand voltage. The sample-hold circuit 1 is formed from a plurality of first circuits $10_1$ to $10_n$ and a signal generation circuit 20 (n is a natural number which can be determined according to a specification of a product).

For example, on the drawing, the left side of a line L is the high-withstand voltage device having the first withstand voltage and the right side of the line L is the low-withstand voltage device having the second withstand voltage. A withstand voltage means a limit value of a voltage that a device and an electronic component can be operable without causing dielectric breakdown. The withstand voltage is, for example, a voltage value determined by rating or the like.

Here, the first withstand voltage is set to 5.5 volts and the second withstand voltage is set to 1.5 volts. In the following explanation, any first circuit representing the plurality of first circuits $10_1$ to $10_n$ is sometimes referred to as a first circuit 10.

An AD converter 40 is connected to the post-stage of the sample-hold circuit 1. The sample-hold circuit 1 is applicable to a delta-sigma (ΔΣ) type AD converter. Details of the delta-sigma type AD converter are explained below. That is, in the following explanation, a switched capacitor circuit including the sample-hold circuit 1 is explained. In FIG. 1, an input terminal 2 of an input signal Vin, an output terminal 4 of an output signal Vout, and an input terminal 6 of a clock signal fclk are further illustrated.

Each of the plurality of first circuits $10_1$ to $10_n$ has an equivalent configuration and is made up of a device included in the first device and having the first withstand voltage (hereinafter referred to as a high-withstand voltage device 10H) and a device included in the second device and having the second withstand voltage (hereinafter referred to as a low-withstand voltage device 10L). Each of the plurality of first circuits $10_1$ to $10_n$ is connected in parallel between a node n2 and a node n4.

Each of the plurality of first circuits $10_1$ to $10_n$ respectively samples the input signal Vin at a respective sampling timing and holds the input signal Vin. That is, the plurality of first circuits $10_1$ to $10_n$ are a so-called time interleave type and can realize a higher sampling rate. A detailed configuration of the plurality of first circuits $10_1$ to $10_n$ is explained below with reference to FIG. 2. Note that the plurality of first circuits $10_1$ to $10_n$ according to this embodiment correspond to circuits connected in parallel to the input terminal Vin and the output terminal Vout.

Similarly, the signal generation circuit 20 is made up of a device included in the second device and having the first withstand voltage (hereinafter referred to as a high-withstand voltage device 20H) and a device having the second withstand voltage (hereinafter referred to as a low-withstand voltage device 20L). The signal generation circuit 20 outputs a first control signal 202 obtained by level-up shifting a signal based on a common clock signal fclk to a device on the first withstand voltage side of the first circuits $10_1$ to $10_n$ from the device having the first withstand voltage.

The signal generation circuit 20 outputs a second control signal 204 based on the clock signal fclk to a device on the second withstand voltage side of the first circuits $10_1$ to $10_n$ from the device having the second withstand voltage. The level-up shift means further increasing signal amplitude. For example, a signal having one-volt amplitude is converted into a signal having a five-volt amplitude by the level-up shift. Conversely, level-down shift means further reducing the signal amplitude.

In general, an operable frequency is lower in a higher-withstand voltage device. That is, the high-withstand voltage device on the first withstand voltage side is lower in speed than the low-withstand voltage device on the second withstand voltage side. When a clock signal fclk1 of the high-withstand voltage device on the first withstand voltage side and a clock signal fclk2 of the low-withstand voltage device on the second withstand voltage side are respectively supplied from separate clock sources, it is highly likely that it is difficult to control a relative relation between both the clocks fclk1 and fclk2 in a clock generation circuit of the sample-hold circuit.

Therefore, in this embodiment, in the signal generation circuit 20, first, the low-withstand voltage device on the second withstand voltage side generates the second control signal on the basis of the clock signal fclk. On the other hand, the high-withstand voltage device on the first withstand voltage side generates the first control signal 202 using a clock signal fclk' based on the clock signal fclk2 of the low-withstand voltage device on the second withstand voltage side.

The clock signal fclk may be directly used as the clock signal fclk'. The clock signal fclk of the low-withstand voltage device on the second withstand voltage side may be level-up shifted and used as a modulated clock signal. This clarifies a relative relation between clock frequencies and phases of the high-withstand voltage device on the first withstand voltage side and the low-withstand voltage device on the second withstand voltage side and facilitates control. The signal generation circuit 20 generates the first control signal 202 and the second control signal 204 respectively with the device on the first withstand voltage side and the device on the second withstand voltage side. This makes it possible to satisfy the withstand voltages of the devices on the first withstand voltage side and the second withstand voltage side.

Figure 2:
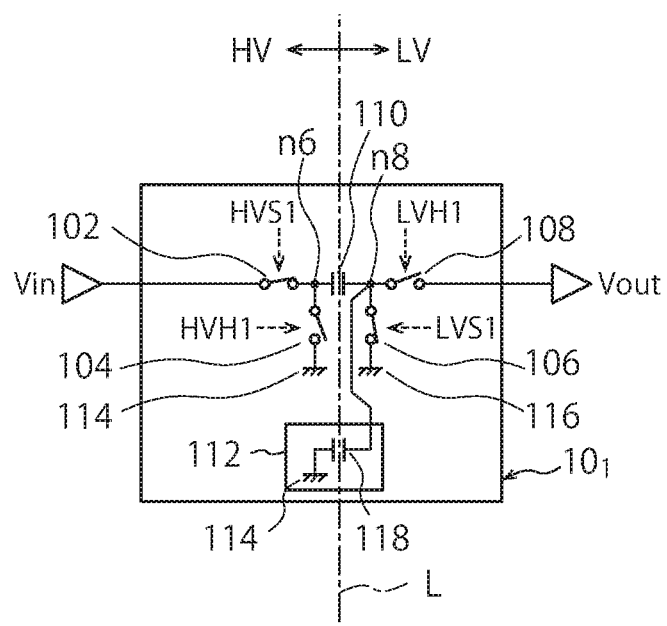
FIG. 2 is a circuit diagram showing a detailed configuration example of a first circuit of the sample-hold circuit according to the first embodiment.

FIG. 2 is a circuit diagram showing a detailed configuration example of one of the first circuits $10_1$ to $10_n$ shown in FIG. 1. The first circuit 10 includes first to fourth switch elements 102, 104, 106, and 108, a first capacitor 110, and a voltage suppression circuit 112. In FIG. 2, a first signal HVS1 and a second signal HVH1 are further illustrated as the first control signal 202 of the first-withstand-voltage-side device shown in FIG. 1. A third signal LVS1 and a fourth signal LVH1 are further illustrated as the second control signal 204 of the second-withstand-voltage-side device shown in FIG. 1.

The first to fourth switch elements 102, 104, 106, and 108 are made up of, for example, MOS transistors. More specifically, the first switch element 102 is a switch element having the first withstand voltage. One end of the first switch element 102 is connected to the input terminal 2. The other end of the first switch element 102 is connected to one end (a node n6) on the first withstand voltage side in the first capacitor 110.

The first switch element 102 comes into a conduction state or a cut-off state according to the first signal HVS1 output from the device having the first withstand voltage in the signal generation circuit 20. More in detail, the first switch element 102 comes into the conduction state when the first signal HVS1 is at an H level and comes into the cut-off state when the first signal HVS1 is at an L level.

The second switch element 104 is a switch element having the first withstand voltage. One end of the second switch element 104 is connected to the one end (the node n6) on the first withstand voltage side in the first capacitor 110. The other end of the second switch element 104 is connected to a common mode voltage 114 on the first withstand voltage side. The second switch element 104 operates according to the second signal HVH1 output from the device having the first withstand voltage in the signal generation circuit 20. More specifically, the second switch element 104 comes into the conduction state when the second signal HVH1 is at the H level and comes into the cut-off state when the second signal HVH1 is at the L level. The common mode voltage 114 of the device on the first withstand voltage side is, for example, 2.5 volts.

The third switch element 106 is a switch element having the second withstand voltage. One end of the third switch element 106 is connected to the other end (a node n8) on the second withstand voltage side in the first capacitor 110. The other end of the third switch element 106 is connected to a common mode voltage 116 of the device on the second withstand voltage side. The third switch element 106 operates according to the third signal LVS1 output from the device having the second withstand voltage in the signal generation circuit 20.

More specifically, the third switch element 106 comes into the conduction state when the third signal LVS1 is at the H level and comes into the cut-off state when the third signal LVS1 is at the L level. The common mode voltage 116 of the device on the second withstand voltage side is, for example, 0.5 volt. Note that the common mode voltages 114 and 116 shown in FIG. 2 are the ground in an alternating current (AC) manner.

The fourth switch element 108 is a switch element having the second withstand voltage. One end of the fourth switch element 108 is connected to the other end (the node n8) on the second withstand voltage side in the first capacitor 110. The other end of the fourth switch element 108 is connected to the output terminal 4. The fourth switch element 108 operates according to the fourth signal LVH1 output from the device having the second withstand voltage in the signal generation circuit 20. More specifically, the fourth switch element 108 comes into the conduction state when the fourth signal LVH1 is at the H level and comes into the cut-off state when the fourth signal LVH1 is at the L level.

The first capacitor 110 is a capacitor for sample and hold. One end of the first capacitor 110 is connected to the other end (the node n6) of the first switch element 102. The other end of the first capacitor 110 is connected to one end (the node n8) of the fourth switch element 108.

The voltage suppression circuit 112 suppresses a voltage at the node n8. The voltage suppression circuit 112 includes a second capacitor 118. One end of the second capacitor 118 is connected to the other end (the node n8) on the second withstand voltage side in the first capacitor 110. The other end of the second capacitor 118 is connected to the common mode voltage 114 on the first withstand voltage side. For example, the capacitance of the first capacitor 110 is C1. The capacitance of the second capacitor 118 is C2. As it is seen from this, electric charges are redistributed according to a ratio of the input capacitance C1 and the input capacitance C2. The voltage at the node n8 is converted into a withstand voltage range on the second withstand voltage side.

A configuration example of the signal generation circuit 20 is explained with reference to FIGS. 3 and 4.

Figure 3:
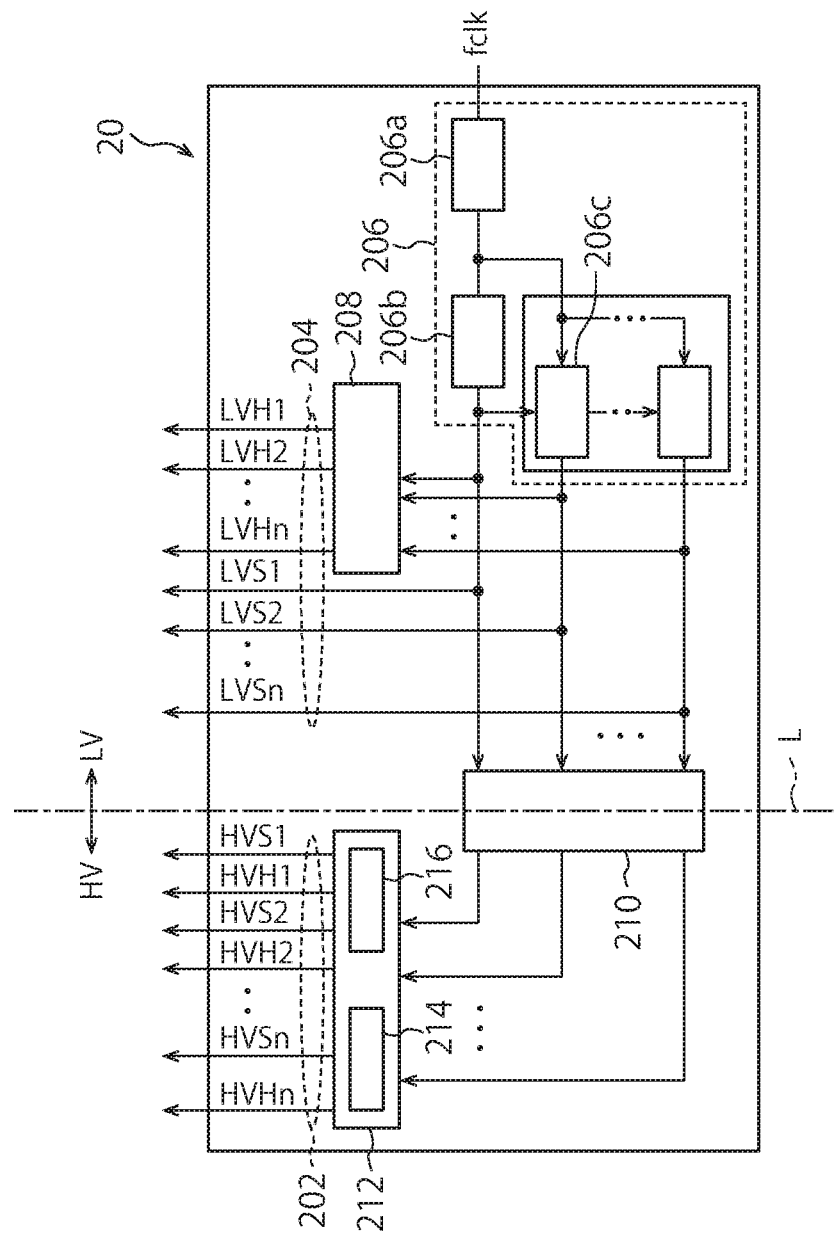
FIG. 3 is a diagram showing a circuit configuration example of a signal generation circuit of the sample-hold circuit according to the first embodiment.

FIG. 3 is a diagram showing a circuit configuration example of the signal generation circuit 20. The signal generation circuit 20 generates first signals HVS1 to HVSn and second signals HVH1 to HVHn by level-up shifting a signal based on the clock signal fclk input to the device on the second withstand voltage side or the clock signal fclk. The signal generation circuit 20 generates third signals LVS1 to LVSn and fourth signals LVH1 to LVHn based on the clock signal fclk. 1 to n, which are identifiers of the respective signals, correspond to the plurality of first circuits $10_1$ to $10_n$ (FIG. 1).

As explained above, the period of the H level is the conduction state and the period of the L level is the cut-off state. Here, a signal corresponding to the period of the H level is referred to as a conduction period signal. A signal corresponding to the period of the L level is referred to as a cut-off period signal. Overlap means that periods of conduction period signals overlap between the signals. On the other hand, non-overlap means that the periods of the conduction period signals do not overlap between the signals.

Figure 4:
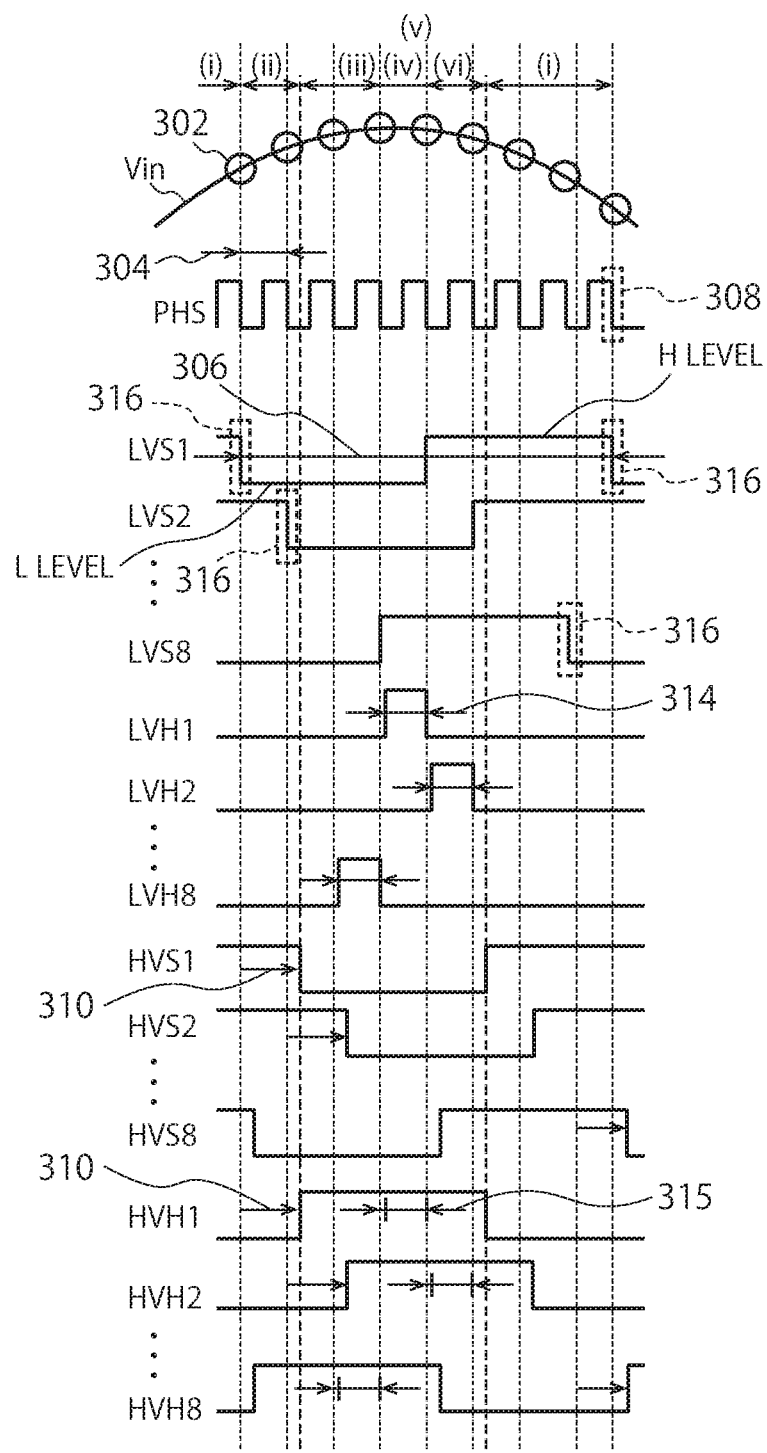
FIG. 4 is a diagram showing an example of a time chart of signals generated by the signal generation circuit according to the first embodiment.

FIG. 4 is a diagram showing an example of a time chart of signals generated by the signal generation circuit 20. The horizontal axis indicates an elapsed time. The vertical axes respectively indicate, from an upper stage, the input signal Vin, a first reference clock signal PHS on the second withstand voltage side, the third signals LVS1 to LVSn, the fourth signals LVH1 to LVHn, the first signals HVS1 to HVSn, and the second signals HVH1 to HVHn. In each of the input signal Vin, the first reference clock signal PHS on the second withstand voltage side, the third signals LVS1 to LVSn, the fourth signals LVH1 to LVHn, the first signals HVS1 to HVSn, and the second signals HVH1 to HVHn, an upper line indicates the H level and a lower line indicates the L level.

Here, to simplify explanation, it is assumed that n is equal to 8. So, signals LVS1 to LVS8, LVH1 to LVH8, HVS1 to HVS8, and HVH1 to HVH8 are shown in FIG. 4. However, n is not limited to this. The amplitude of the first signals HVS1 to HVSn and the second signals HVH1 to HVHn is larger than the amplitude of the third signals LVS1 to LVSn and the fourth signals LVH1 to LVHn. However, the amplitudes are illustrated as the same amplitude in FIG. 4.

Sampling timings of the input signal Vin are respectively indicated by circles 302. A cycle 304 of the first reference clock signal PHS is set to 1/Fclk=1/(n·data rate). The "data rate" corresponds to the number of samples per second. That is, the cycle 304 of the first reference clock signal PHS is a 1/n cycle of the data rate and is referred to as a data rate cycle.

For example, in the case of the delta-sigma type AD converter, one AD conversion is carried out at the 1/n cycle of the data rate. Cycles 306 of the first signals HVS1 to HVSn, the second signals HVH1 to HVHn, the third signals LVS1 to LVSn, and fourth signals LVH1 to LVHn are n times as large as the cycle 304 of the first reference clock signal PHS. That is, it can be said that oversampling is performed at a rate n times as high as the data rate. Periods (i) to (vi) correspond to switching operations shown in FIG. 5 explained below.

As shown in FIG. 3, the signal generation circuit 20 includes a first second-withstand-voltage-side signal generation circuit 206, a second second-withstand-voltage-side signal generation circuit 208, an up-shift circuit 210, and a first withstand-voltage-side signal generation circuit 212.

The first second-withstand-voltage-side signal generation circuit 206 generates the third signals LVS1 to LVSn on the second withstand voltage side on the basis of the clock signal fclk. The first second-withstand-voltage-side signal generation circuit 206 includes a first frequency modulation circuit 206a, a second frequency modulation circuit 206b, and a plurality of one-cycle delay circuits 206c.

The first frequency modulation circuit 206a generates the first reference clock signal PHS on the second withstand voltage side on the basis of the clock signal fclk. The second frequency modulation circuit 206b modulates the first reference clock signal PHS into the third signal LVS1 having a 1/n-times frequency: n corresponds to the plurality of first circuits $10_1$ to $10_n$ as explained above.

Each of the plurality of one-cycle delay circuits 206c delays the third signal LVS1 by one cycle of the first reference clock signal PHS at a time and generates the third signals LVS2 to LVSn. That is, the number of the plurality of one-cycle delay circuits 206c is n−1.

As shown in FIG. 4, switching timings 316 of the respective third signals LVS1 to LVSn from the conduction period signals to the cut-off period signals coincide with switching timings of the first reference clock signal PHS from the H signal to the L signal. In this way, the switching timings 316 of the respective third signals LVS1 to LVSn from the conduction period signals to the cut-off period signals correspond to the sampling timings 302 of the input signal Vin. Sampling time of each of the third signals LVS1 to LVSn shifts by one cycle 304 of the data rate. This makes it possible to realize time interleaving. In this embodiment, the switching timings 316 of the third signals LVS1 to LVSn from the conduction period signals to the cut-off period signals are defined as the sampling timings 302 of the input signal Vin.

As shown in FIG. 3, the second second-withstand-voltage-side signal generation circuit 208 generates the fourth signals LVH1 to LVHn non-overlapping signals corresponding thereto among the first signals HVS1 to HVSn and the third signals LVS1 to LVSn. The second second-withstand-voltage-side signal generation circuit 208 generates the fourth signals LVH1 to LVHn such that periods (periods in which the H level continues) 314 of the conduction period signals of the respective fourth signals LVH1 to LVHn are smaller than the one cycle 304 of the data rate. In other words, the fourth signals LVH1 to LVHn are respectively non-overlap signals.

As shown in FIG. 4, each of the fourth signals LVH1 to LVHn is synchronized with the first reference clock signal PHS. The period 314 of the conduction period signal is set smaller than the one cycle 304 of the data rate. The periods 314 of the conduction period signals of the fourth signals LVH1 to LVHn are set on the basis of switching timings of the third signals LVS1 to LVSn from the cut-off period signals to the conduction period signals.

For example, it is possible to expand, as the periods 314 of the conduction period signals of the fourth signals LVH1 to LVHn are brought closer to the switching timings of the third signals LVS1 to LVSn from the cut-off period signals to the conduction period signals, a range in which delays 310 of the first signals HVS1 to HVSn explained below can be allowed. That is, it is possible to reduce possibility that, as the periods 314 of the conduction period signals of the fourth signals LVH1 to LVHn are brought closer to the switching timings of the third signals LVS1 to LVSn from the cut-off period signals to the conduction period signals, the first signals HVS1 to HVSn and the fourth signals LVH1 to LVHn corresponding thereto overlap.

The fourth signals LVH1 to LVHn are respectively configured as non-overlap signals with respect to one another. It is possible to set in advance, the periods 314 of the conduction period signals and times of the fourth signals LVH1 to LVHn according to this embodiment on the basis of, for example, design values.

As shown in FIG. 3, the up-shift circuit 210 level-up shifts the third signals LVS1 to LVSn and outputs the third signals LVS1 to LVSn to the first withstand-voltage-side signal generation circuit 212. Note that the up-shift circuit 210 may generate the third signals LVS1 to LVSn with circuits equivalent to the plurality of first second-withstand-voltage-side signal generation circuits 206 after leveling up the clock signal fclk.

The first withstand-voltage-side signal generation circuit 212 generates the first signals HVS1 to HVSn and the second signals HVH1 to HVHn on the basis of signals obtained by level-up shifting the third signals LVS1 to LVSn. That is, the first withstand-voltage-side signal generation circuit 212 includes a first first-withstand-voltage-side signal generation circuit 214 and a second first-withstand-voltage-side signal generation circuit 216.

The first first-withstand-voltage-side signal generation circuit 214 generates the first signals HVS1 to HVSn on the basis of signals obtained by the up-shift circuit 210 level-up shifting the third signals LVS1 to LVSn. As shown in FIG. 4, the delays 310 occur when the up-shift circuit 210 performs level-up shift. That is, the first signals HVS1 to HVSn are signals with the delays 310 from the third signals LVS1 to LVSn. As explained above, the first signals HVS1 to HVSn overlap the third signals LVS1 to LVSn corresponding thereto.

The second first-withstand-voltage-side signal generation circuit 216 generates the second signals HVH1 to HVHn on the basis of signals obtained by the up-shift circuit 210 level-up shifting the third signals LVS1 to LVSn. As shown in FIG. 4, the delays 310 also occur in the second signals HVH1 to HVHn. The second first-withstand-voltage-side signal generation circuit 216 generates the second signals HVH1 to HVHn as non-overlap signals not overlapping the first signals HVS1 to HVSn. That is, periods before and after a period of the conduction period signal of each of the second signals HVH1 to HVHn are formed shorter than periods before and after a period of the cut-off period signal of each of the first signals HVS1 to HVSn corresponding thereto.

This may be vice versa. Further, the second first-withstand-voltage-side signal generation circuit 216 generates the second signals HVH1 to HVHn as overlap signals overlapping the fourth signals LVH1 to LVHn. That is, the conduction period signals 314 of the second signals HVH1 to HVHn and the conduction period signals of the fourth signals LVH1 to LVHn have overlapping hold periods 315.

Figure 5:
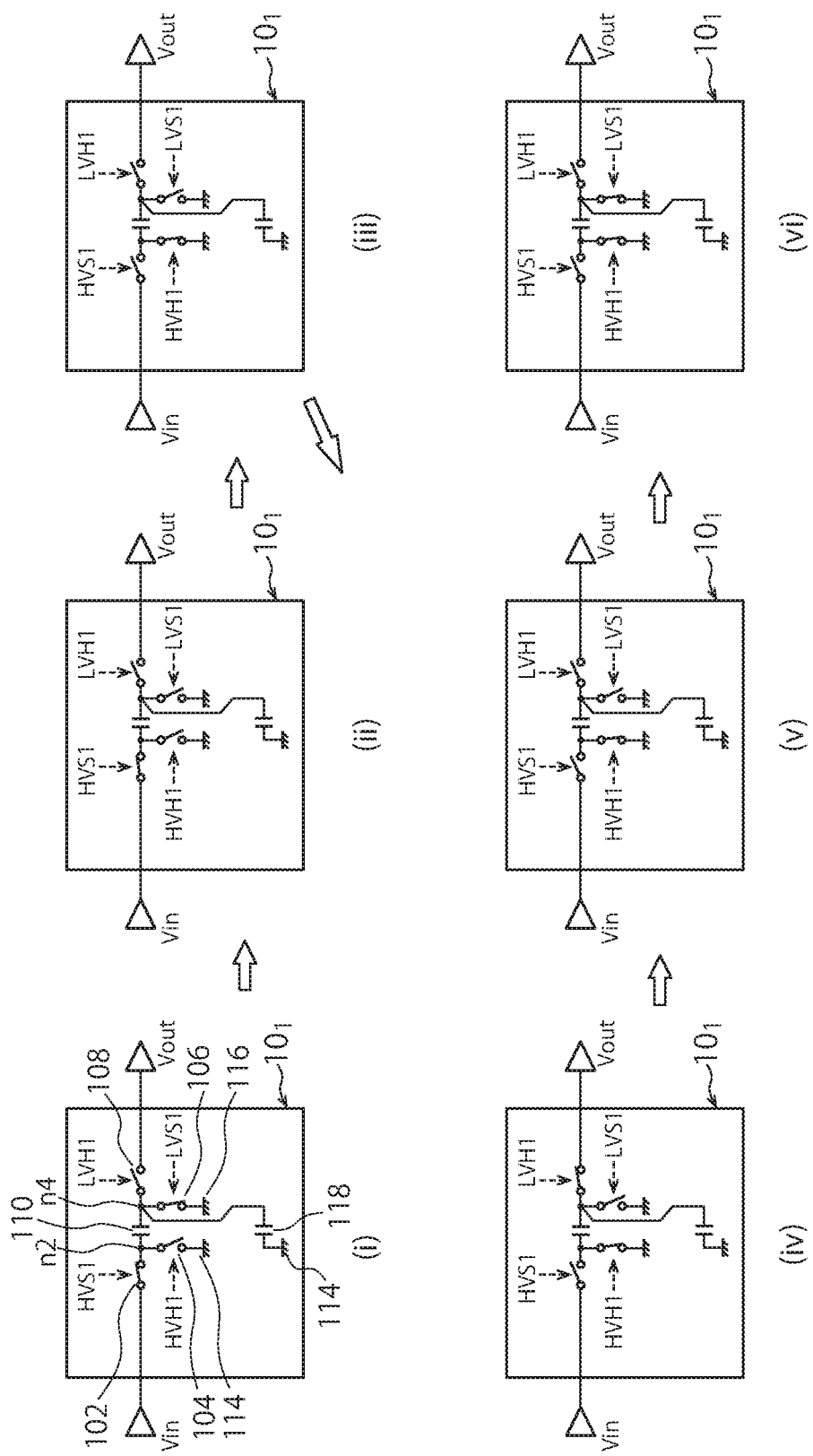
FIG. 5 is a diagram for explaining a switching operation of a first circuit according to the first embodiment.

FIG. 5 is a diagram for explaining a switching operation of the first circuit 10. As explained above, states (i) to (vi) shown in FIG. 5 respectively correspond to the periods (i) to (vi) shown in FIG. 4. The first circuits $10_1$ to $10_n$ perform the same operation except that the sampling timings 302 (FIG. 4) are different. Therefore, explanation of the operation of the other first circuits is omitted.

First, in the period (i), the conduction period signals of the first signal HVS1 and the third signal LVS1 are applied to each of the first switch element 102 and the third switch element 106. The period (i) is a sampling period of the input signal Vin.

Subsequently, in the period (ii), the third signal LVS1 is switched from the conduction period signal to the cut-off period signal at a timing 308 when the first reference clock signal PHS falls from the H signal to the L signal. The third switch element 106 comes into the cut-off state at this timing and the sampling period ends.

Subsequently, in the period (iii), after the time delay 310 (FIG. 4) elapses from the timing when the third signal LVS1 is switched from the conduction period signal to the cut-off period signal, the first signal HVS1 is switched from the conduction period signal to the cut-off period signal. The first switch element 102 comes into the cut-off state at this timing. In general, it is known that sampling performance is improved when the third switch element 106 comes into the cut-off state first and the first switch element 102 subsequently comes into the cut-off state. It is also possible to further improve the sampling performance by using the time delay 310 (FIG. 4) by the up-shift circuit 210 in this way.

Subsequently, the second signal HVH1 is switched from the cut-off period signal to the conduction period signal. The second switch element 104 comes into the conduction state at this timing. Consequently, electric charges are redistributed at a ratio of the capacitance C1 of the first capacitor 110 and the capacitance C2 of the second capacitor 118. The voltage at the node n4 is converted into a withstand voltage range on the second withstand voltage side.

Subsequently, in the period (iv), the fourth signal LVH1 is switched from the cut-off period signal to the conduction period signal. The fourth switch element 108 comes into the conduction state at this timing. Consequently, the hold period 315 (FIG. 4) starts and the output signal Vout is output.

Subsequently, in the period (v), the fourth signal LVH1 is switched from the conduction period signal to the cut-off period signal. The fourth switch element 108 comes into the cut-off state at this timing. Consequently, the hold period 315 ends. In this way, the hold period 315 (FIG. 4) is set by an overlap period of the conduction period signal of the second signal HVH1 and the conduction period signal of the fourth signal LVH1.

Subsequently, in the period (vi), the third signal LVS1 is switched from the cut-off period signal to the conduction period signal. The third switch element 106 comes into the conduction state at this timing. Consequently, the first capacitor 110 retains electric charges corresponding to a difference between the common mode voltage on the first withstand voltage side and the common mode voltage on the second withstand voltage side. Subsequently, after the second signal HVH1 is switched from the conduction period signal to the cut-off period signal, the first signal HVS1 is switched from the cut-off period signal to the conduction period signal and a sampling period of the period (i) is started.

In this way, it is possible to set the sampling timing and the period of the first circuit 10 on the basis of the third signal LVS1 on the second withstand voltage side without the time delay 310 (FIG. 4). Similarly, it is possible to set the hold timing and the hold period on the basis of the fourth signal LVH1 on the second withstand voltage side without the time delay 310 (FIG. 4). This makes it possible to generate the sample period and the hold period in periods equivalent to the data rate cycle 304.

The frequency of the first circuit 10 is 1/n times as large as the data rate. However, it is possible to maintain the sample timing and the hold timing synchronized with the cycle of the data rate by connecting n first circuits 10 in parallel and operating the n first circuits 10. Consequently, even when electric withstand voltages are different between an input and an output of a signal, an overvoltage is not applied to the respective devices and high-speed sampling can be performed.

As explained above, with the sample-hold circuit 1 according to this embodiment, the first circuit 10 includes the switch elements 102 and 104 on the first withstand voltage side connected to the one end (the node n6) on the first withstand voltage side of the first capacitor 110 and configured to operate according to the first control signal 202 output from the device having the first withstand voltage and the switch elements 106 and 108 on the second withstand voltage side connected to the other end (the node n8) on the second withstand voltage side of the first capacitor 110 and configured to operate according to the second control signal 204 output from the device having the second withstand voltage. This makes it possible to satisfy operation conditions of withstand voltages and clock frequencies in the respective devices on the first withstand voltage side and the second withstand voltage side.

The first control signal 202 is generated by level-up shifting the signal based on the clock signal fclk input to the device on the second withstand voltage side. Therefore, a relative relation between clock frequencies and phases between the first control signal 202 and the second control signal 204 is clarified. It is possible to cope with a delay caused by a withstand voltage difference.

First Modification of the First Embodiment

The sample-hold circuit 1 according to a first modification of the first embodiment is different from the sample-hold circuit 1 according to the first embodiment in that the sample-hold circuit 1 according to the first modification of the first embodiment includes a second voltage suppression circuit 30. Differences from the sample-hold circuit 1 according to the first embodiment are explained below.

Figure 6:
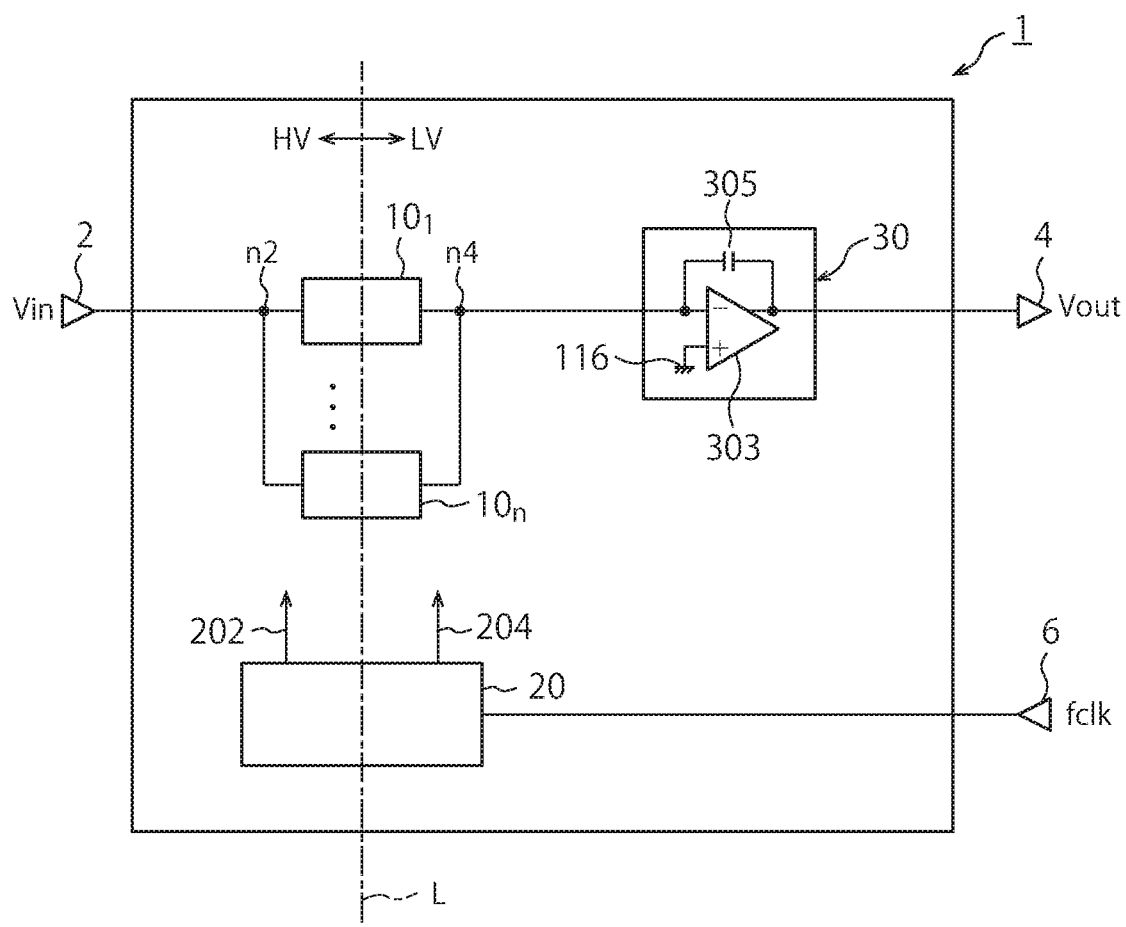
FIG. 6 is a block diagram showing a configuration example of a sample-hold circuit according to a first modification of the first embodiment.

FIG. 6 is a block diagram showing a configuration example of the sample-hold circuit 1 according to the first modification of the first embodiment. The second voltage suppression circuit 30 includes an operational amplifier 303 and a third capacitor 305. An inverted input terminal of the operational amplifier 303 is connected between the node n4 and the output terminal 4. A non-inverted input terminal of the operational amplifier 303 is connected to the common mode voltage 116 on the second withstand voltage side. An output terminal of the operational amplifier 303 is connected to the output terminal 4.

The third capacitor 305 is connected to the inverted input terminal of the operational amplifier 303 and the output terminal 4. The capacitance of the third capacitor 305 is C3.

When the second switch element 104 and the fourth switch element 108 shown in FIG. 2 are in the conduction state and the first switch element 102 and the third switch element 106 are in the cut-off state, charge distribution is performed between the capacitance C1 of the first capacitor 110 and the capacitance C3 of the third capacitor 305. An output voltage Vout=(C1/C3)×Vin from the output terminal 4 is suppressed in a range of the second withstand voltage.

In this way, the inverted input terminal is connected to a terminal on an output side of the fourth switch element 108 (FIG. 2) and a second output terminal of the operational amplifier 303 is connected to the output terminal 4. It is possible to suppress, with an operational amplifier having negative feedback, the output voltage Vout from the node n4 and the output terminal 4 to the range of the second withstand voltage.

Second Embodiment

The sample-hold circuit 1 according to the first embodiment fixedly sets the periods 314 (FIG. 4) of the conduction period signals of the fourth signals LVH1 to LVHn in the range in which the delays 310 of the first signals HVS1 to HVSn can be allowed. On the other hand, the sample-hold circuit 1 according to the second embodiment is different from the sample-hold circuit 1 according to the first embodiment in that the sample-hold circuit 1 according to the second embodiment automatically sets the periods 314 of the conduction period signals of the fourth signals LVH1 to LVHn according to the delays 310 of the first signals HVS1 to HVSn. Differences from the sample-hold circuit 1 according to the first embodiment are explained below.

A circuit configuration of the signal generation circuit 20 according to the second embodiment is explained with reference to FIGS. 7 and 8.

Figure 7:
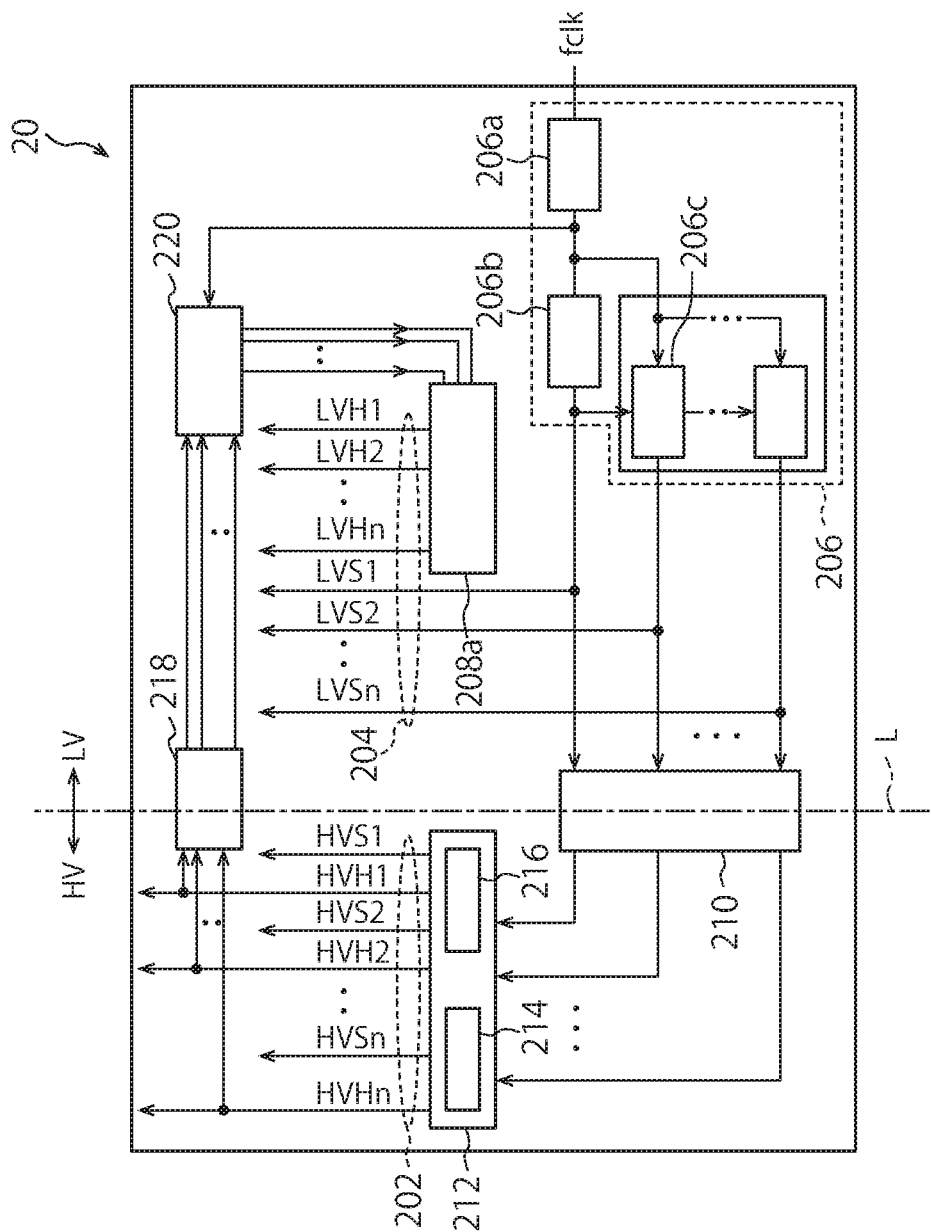
FIG. 7 is a diagram showing a circuit configuration example of a signal generation circuit according to a second embodiment.

FIG. 7 is a diagram showing a circuit configuration example of the signal generation circuit 20 according to the second embodiment. The signal generation circuit 20 according to the second embodiment is different from the signal generation circuit 20 according to the first embodiment in that the signal generation circuit 20 according to the second embodiment includes a second second-withstand-voltage-side signal generation circuit 208*a*, a down-shift circuit 218, and a synchronization circuit 220.

Figure 8:
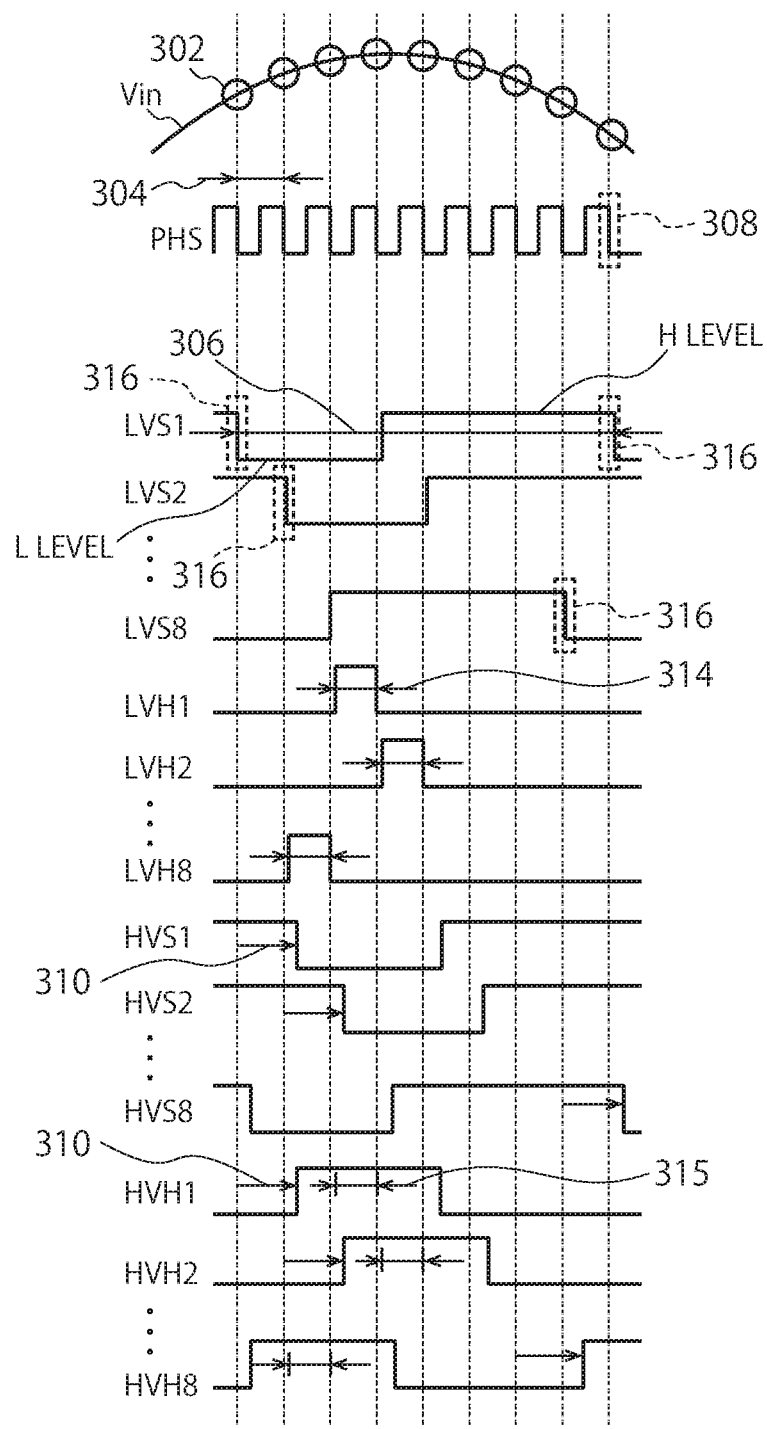
FIG. 8 is a diagram showing an example of a time chart of signals generated by the signal generation circuit according to the second embodiment.

FIG. 8 is a diagram showing an example of a time chart of signals generated by the signal generation circuit 20 according to the second embodiment. The horizontal axis indicates an elapsed time. The vertical axes respectively indicate, from an upper stage, the input signal Vin, the first reference clock signal PHS on the second withstand voltage side, the third signals LVS1 to LVSn, the fourth signals LVH1 to LVHn, the first signals HVS1 to HVSn, and the second signals HVH1 to HVHn.

As shown in FIG. 7, the down-shift circuit 218 is a circuit that level-down shifts the second signals HVH1 to HVHn. That is, the down-shift circuit 218 sets the amplitude of the second signals HVH1 to HVHn smaller. Consequently, the amplitude of the second signals HVH1 to HVHn is converted into the range of the second withstand voltage. Note that the down-shift circuit 218 may level-down shift the first signals HVS1 to HVSn.

The synchronization circuit 220 adjusts, on the basis of start timings of the conduction period signals of the second signals HVH1 to HVHn, start periods of the conduction period signals of signals obtained by level-down shifting the second signals HVH1 to HVHn to be later than the start timings of the conduction period signals of the second signals HVH1 to HVHn and synchronized with a start period of the L level in the first reference clock signal PHS.

More specifically, the synchronization circuit 220 adjusts, on the basis of the delays 310 of the first signals HVS1 to HVSn, the start periods of the conduction period signals of the signals obtained by level-down shifting the second signals HVH1 to HVHn to be synchronized with the start period of the L level in the first reference clock signal PHS temporally closest to the start periods. The second second-withstand-voltage-side signal generation circuit 208 modulates the periods 314 of the conduction period signals of the signals output by the synchronization circuit 220 to be smaller than the data rate cycle 304 and generates the fourth signals LVH1 to LVHn.

As explained above, according to this embodiment, the sample-hold circuit 1 sets the periods 314 of the conduction period signals of the fourth signals LVH1 to LVHn according to the delays 310 of the first signals HVS1 to HVSn. Consequently, even if the delays 310 of the first signals HVS1 to HVSn fluctuate because of an environmental factor or the like, it is possible to generate the fourth signals LVH1 to LVHn not overlapping the first signals HVS1 to HVSn.

Further, the start periods of the periods 314 of the conduction period signals of the fourth signals LVH1 to LVHn are adjusted to be later than the start timings of the cut-off period signals of the first signals HVS1 to HVSn and coincide with the start period of the L level in the first reference clock signal PHS. This makes it possible to bring the hold periods 315, which are the overlap periods of fourth signals LVH1 to LVHn and the second signals HVH1 to HVHn, closer to the start periods of the conduction period signals of the second signals HVH1 to HVHn. It is possible to set the start periods of the hold periods earlier.

Third Embodiment

The sample-hold circuit 1 according to the first embodiment sets the length of the periods 314 (FIG. 4) of the conduction period signals in the fourth signals LVH1 to LVHn to the fixed value. On the other hand, the sample-hold circuit 1 according to a third embodiment sets the length of the periods 314 (FIG. 4) of the conduction period signals in the fourth signals LVH1 to LVHn according to a mask signal PHI. Differences from the sample-hold circuit 1 according to the first embodiment are explained below.

Figure 9:
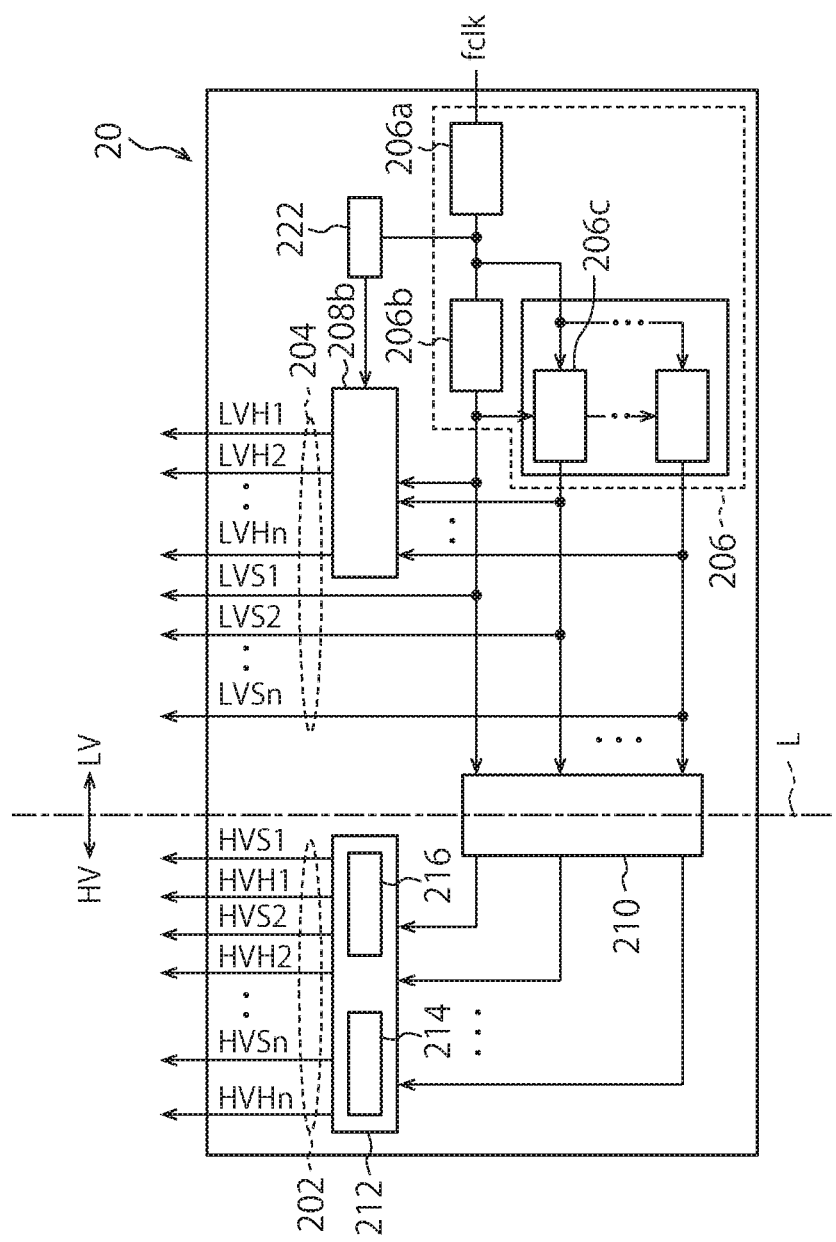
FIG. 9 is a diagram showing a circuit configuration example of a signal generation circuit according to a third embodiment.

FIG. 9 is a diagram showing a circuit configuration example of the signal generation circuit 20 according to the third embodiment.

Figure 10:
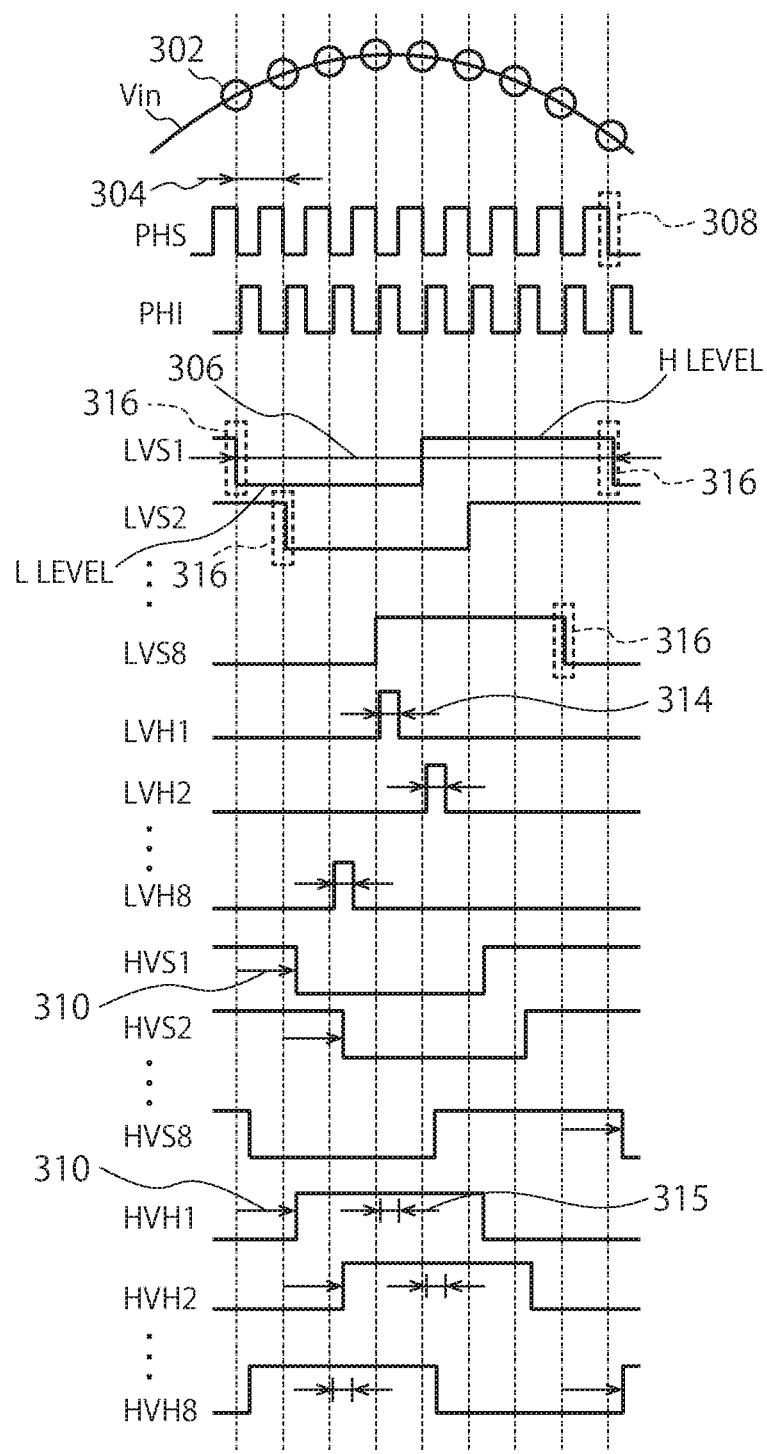
FIG. 10 is a diagram showing an example of a time chart of signals generated by the signal generation circuit according to the third embodiment.

FIG. 10 is a diagram showing an example of a time chart of signals generated by the signal generation circuit 20 according to the third embodiment. The horizontal axis indicates an elapsed time. The vertical axes respectively indicate, from an upper stage, the input signal Vin, the first reference clock signal PHS on the second withstand voltage side, the mask signal PHI, the third signals LVS1 to LVSn, the fourth signals LVH1 to LVHn, the first signals HVS1 to HVSn, and the second signals HVH1 to HVHn.

As shown in FIG. 9, the signal generation circuit 20 according to the third embodiment is different from the signal generation circuit 20 according to the first embodiment in that the signal generation circuit 20 according to the third embodiment includes a second second-withstand-voltage-side signal generation circuit 208*b* and a mask-signal generation circuit 222.

The mask-signal generation circuit 222 generates an inverted signal and a non-overlap signal of the first reference clock signal PHS. The second second-withstand-voltage-side signal generation circuit 208*b* modulates the period 314 of the conduction period signal of a signal output by the first second-withstand-voltage-side signal generation circuit 206 to coincide with a period of the H level of the mask signal PHI and generates the fourth signals LVH1 to LVHn.

As explained above, according to this embodiment, the signal generation circuit 20 sets the periods 314 of the conduction period signals of the fourth signals LVH1 to LVHn to coincide with the period of the H level of the mask signal PHI. This makes it possible to generate the fourth signals LVH1 to LVHn synchronized with the H level of the mask signal PHI and not overlapping the first signals HVS1 to HVSn.

Fourth Embodiment

An example is explained in which the sample-hold circuit 1 according to the third embodiment is applied to a first-stage integration circuit 50*a* of a delta-sigma type AD converter 40*a*.

A circuit configuration example of the first-stage integration circuit 50*a* and a next-stage integration circuit 50*b* of the delta-sigma type AD converter 40*a* according to a fourth embodiment is explained with reference to FIGS. 11 and 12.

Figure 11:
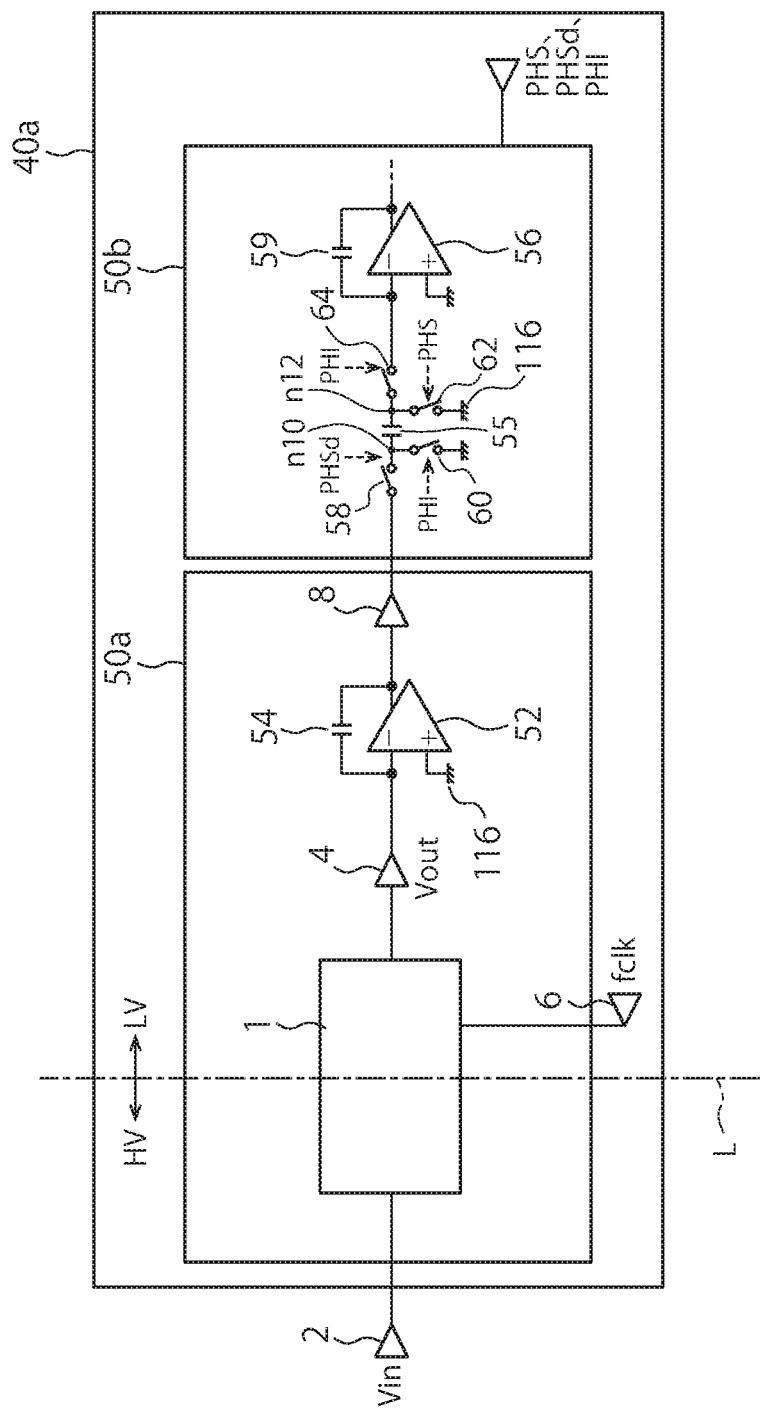
FIG. 11 is a diagram showing a circuit configuration example of a delta-sigma type AD converter according to a fourth embodiment.

FIG. 11 is a diagram showing a circuit configuration example of the delta-sigma type AD converter 40*a* according to the fourth embodiment.

Figure 12:
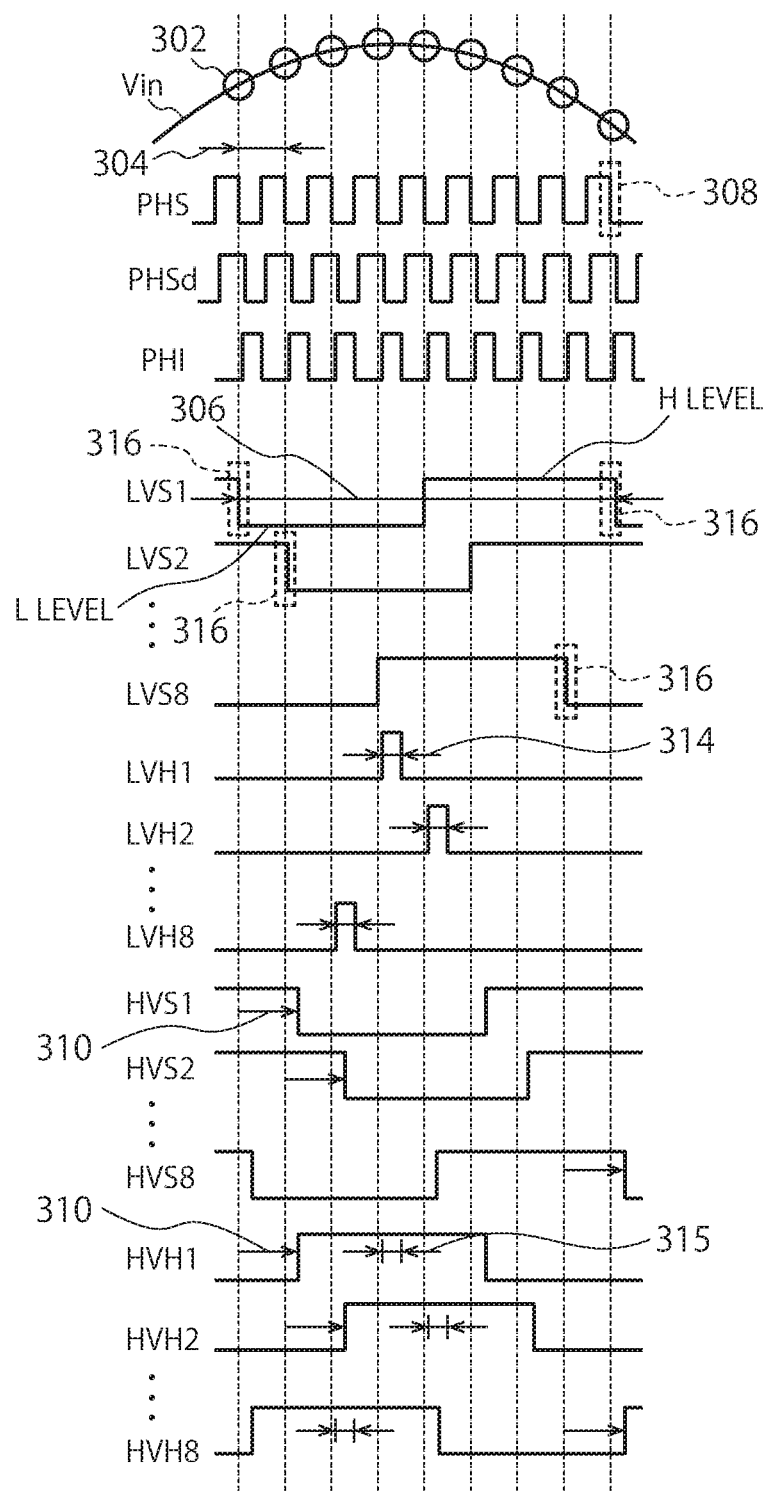
FIG. 12 is a diagram in which a signal PHSd is added to a time chart of signals generated by a signal generation circuit.

FIG. 12 is a diagram in which a signal PHSd is added to a time chart of signals generated by the signal generation circuit 20 according to the fourth embodiment. The horizontal axis indicates an elapsed time. The vertical axes respectively indicate, from an upper stage, the input signal Vin, the first reference clock signal PHS on the second withstand voltage side, the signal PHSd, the mask signal PHI, the third signals LVS1 to LVSn, the fourth signals LVH1 to LVHn, the first signals HVS1 to HVSn, and the second signals HVH1 to HVHn.

As shown in FIG. 11, the delta-sigma type AD converter 40a includes the first-stage integration circuit 50a and the next-stage integration circuit 50b. Besides, the delta-sigma type AD converter 40a includes a comparator, a DA converter, and a differential amplifier not shown in FIG. 11.

The first-stage integration circuit 50a includes the sample-hold circuit 1, an operational amplifier 52, and a fourth capacitor 54. An inverted input terminal of the operational amplifier 52 is connected to the output terminal 4 of the sample-hold circuit 1. A non-inverted input terminal of the operational amplifier 52 is connected to the common mode voltage 116 on the second withstand voltage side. The fourth capacitor 54 is connected to the inverted input terminal of the operational amplifier 52 and an output terminal 8 of the operational amplifier 52.

The next-stage integration circuit 50b includes a fifth capacitor 55, thirty-first to thirty-fourth switch elements 58, 60, 62, and 64, an operational amplifier 56, and a sixth capacitor 59. The fifth capacitor 55 is a capacitor for sample and hold. The fifth capacitor 55 samples and holds a signal output from the first-stage integration circuit 50a. The next-stage integration circuit 50b carries out sampling and holding once at the data rate cycle 304 (FIG. 12).

The thirty-first to thirty-fourth switch elements 58, 60, 62, and 64 are made up of, for example, MOS transistors. More specifically, one end of the thirty-first switch element 58 is connected to the output terminal 8 of the operational amplifier 56. The other end of the thirty-first switch element 58 is connected to one end (a node n10) in the fifth capacitor 55. The thirty-first switch element 58 comes into the conduction state or the cut-off state according to the signal PHSd (FIG. 12) output from the device having the second withstand voltage. The signal PHSd has the same cycle as the cycle of the first reference clock signal PHS. The signal PHSd is switched to the L level after the first reference clock signal PHS is switched to the L level. The signal PHSd is a signal non-overlapping the mask signal PHI.

One end of the thirty-second switch element 60 is connected to the one end (the node n10) in the fifth capacitor 55. The other end of the thirty-second switch element 60 is connected to the common mode voltage 116 of the device on the second withstand voltage side. The thirty-second switch element 60 comes into the conduction state or the cut-off state according to the signal PHI output from the device having the second withstand voltage.

One end of the thirty-third switch element 62 is connected to the other end (a node n12) of the fifth capacitor 55. The other end of the thirty-third switch element 62 is connected to the common mode voltage 116 of the device on the second withstand voltage side. The thirty-third switch element 62 operates according to the first reference clock signal PHS output from the device having the second withstand voltage.

One end of the thirty-fourth switch element 64 is connected to the other end (the node n12) of the fifth capacitor 55. The other end of the thirty-fourth switch element 64 is connected to an inverted input terminal of the operational amplifier 56. The thirty-fourth switch element 64 operates according to the signal PHI output from the device having the second withstand voltage.

The inverted input terminal of the operational amplifier 56 is connected to the other end of the thirty-fourth switch element 64. A non-inverted input terminal of the operational amplifier 56 is connected to the common mode voltage 116 of the device on the second withstand voltage side. The sixth capacitor 59 is connected to the inverted input terminal of the operational amplifier 56 and an output terminal of the operational amplifier 56.

As shown in FIG. 12, the periods 314 of the H level of the fourth signals LVH1 to LVHn are synchronized with the signal PHI. That is, in the hold period 315 of the sample-hold circuit 1, the thirty-first switch element 58 and the thirty-third switch element 62 are in the cut-off state and the thirty-second switch element 60 and the thirty-fourth switch element 64 are in the conduction state.

Consequently, first, in the period 314 of the conduction period signal of the fourth signal LVH1, electric charges accumulated in the first capacitor 110 of the first circuit 10 (FIG. 2) in the sample-hold circuit 1 are distributed to the fourth capacitor 54 and accumulated. At this time, the electric charges accumulated in the fifth capacitor 55 are distributed to the sixth capacitor 59 in the next stage.

Subsequently, in a period in which the first reference clock signal PHS and the signal PHSd overlap, the thirty-first switch element 58 and the thirty-third switch element 62 are in the conduction state and the thirty-second switch element 60 and the thirty-fourth switch element 64 are in the cut-off state. Consequently, the electric charges accumulated in the fourth capacitor 54 are distributed to the fifth capacitor 55.

Subsequently, in the H level period 314 of the fourth signal LVH2, electric charges accumulated in the first capacitor 110 of the first circuit 10 in the next stage in the sample-hold circuit 1 are distributed to the fourth capacitor 54 and accumulated. At this time, the electric charges accumulated in the fifth capacitor 55 are distributed to the sixth capacitor 59.

Subsequently, in a period in which the first reference clock signal PHS and the signal PHSd overlap, the thirty-first switch element 58 and the thirty-third switch element 62 are in the conduction state and the thirty-second switch element 60 and the thirty-fourth switch element 64 are in the cut-off state. Consequently, the electric charges accumulated in the fourth capacitor 54 are distributed to the fifth capacitor 55.

In this way, electric charges based on the input signal Vin sampled in order in the first circuits $10_1$ to $10_n$ (FIG. 1) of the sample-hold circuit 1 are cumulatively accumulated in the fourth capacitor 54. The electric charges cumulatively accumulated in the fourth capacitor 54 is distributed to the fifth capacitor 55 in synchronization with the sample-hold circuit 1. Consequently, the sampling and the holding by the fifth capacitor 55 are repeatedly performed. The electric charges accumulated in the fifth capacitor 55 in order are distributed to the sixth capacitor 59 and cumulatively accumulated.

As explained above, according to this embodiment, the sample-hold circuit 1 is applied to the first-stage integration circuit 50a of the delta-sigma type AD converter 40a. This makes it possible to synchronize the hold period 315 of the input signal having the first withstand voltage with a hold period of the fifth capacitor 55 in which sampling at the data rate is necessary. It is possible to realize the delta-sigma type AD converter 40a that performs sampling once at the data rate cycle 304.

Fifth Embodiment

An example is explained in which the sample-hold circuit 1 according to the third embodiment is applied to a first-stage integration circuit 50c of an incremental delta-sigma type AD converter 40b. The incremental delta-sigma type AD converter 40b according to a fifth embodiment is different from the delta-sigma type AD converter 40a according to the fourth embodiment in that the incremental delta-sigma type AD converter 40b according to the fifth embodiment further includes reset switches 54r and 59r in negative feedback circuits of the operational amplifier 52 and the operational amplifier 56. This reset is often used in an application that generally resets (initializes) an integration circuit at each data rate to request AD conversion without a history (not depending on the past). Differences from the delta-sigma type AD converter 40a according to the fourth embodiment are explained below.

Figure 13:
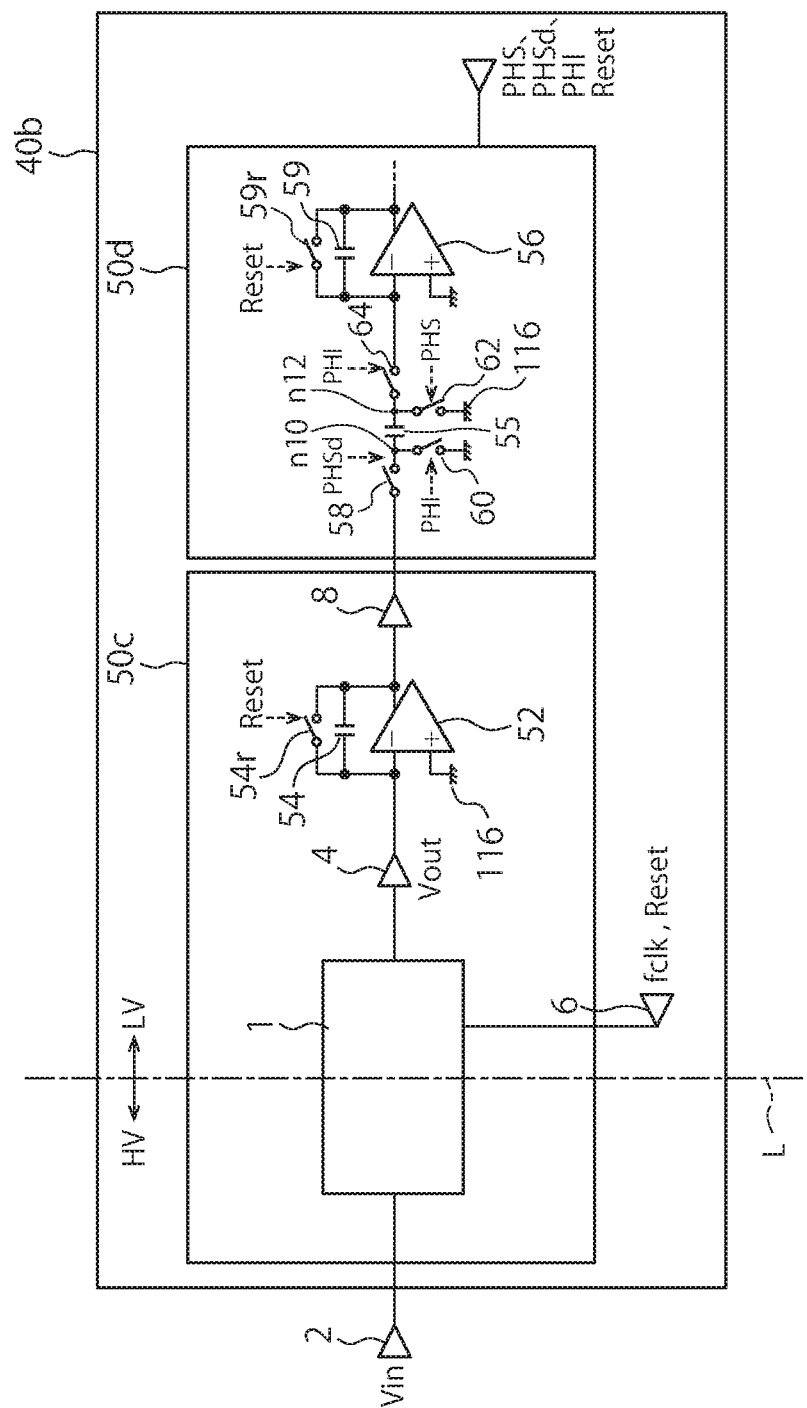
FIG. 13 is a diagram showing a circuit configuration example of an incremental delta-sigma type AD converter according to a fifth embodiment.

FIG. 13 is a diagram showing a circuit configuration example of the incremental delta-sigma type AD converter 40b according to the fifth embodiment. The first-stage integration circuit 50c further includes the reset switch 54r in the inverted input terminal of the operational amplifier 52 and the output terminal 8 of the operational amplifier 52. The reset switch 54r comes into the conduction state or the cut-off state according to a reset signal Reset. That is, the reset switch 54r comes into the conduction state when the reset signal Reset is at the H level and comes into the cut-off state when the reset signal Reset is at the L level. One cycle of the reset signal Reset is n times as large as one cycle of the data rate cycle 304.

When the reset is performed, an integration circuit is initialized (an AD converter is forcibly stopped). When the reset is released, new conversion is started.

A next-stage integration circuit 50d further includes the reset switch 59r in the inverted input terminal of the operational amplifier 56 and the output terminal 8 of the operational amplifier 52. The reset switch 59r is synchronized with the reset switch 54r and comes into the conduction state or the cut-off state according to the reset signal Reset.

In this way, the first-stage integration circuit 50c is different from the first-stage integration circuit 50c in the third embodiment in that the first-stage integration circuit 50c resets the fourth capacitor 54 at a cycle n times as large as the data rate cycle 304. Similarly, the next-stage integration circuit 50d is different from the next-stage integration circuit 50d in the third embodiment in that the next-stage integration circuit 50d resets the sixth capacitor 59 at a cycle n times as large as the data rate cycle 304.

As explained above, according to this embodiment, the sample-hold circuit 1 is applied to the first-stage integration circuit 50c of the incremental delta-sigma type AD converter 40b. This makes it possible to synchronize the hold period 315 of the input signal at the first withstand voltage with the hold period of the fifth capacitor 55 in the next-stage integration circuit 50d in which sampling at the data rate is necessary and reset the sixth capacitor 59 at the cycle n times as large as one cycle 304 of the data rate. It is possible to realize the incremental delta-sigma type AD converter 40b that performs sampling at the data rate cycle 304.

Sixth Embodiment

The delta-sigma type AD converter 40a according to a sixth embodiment is different from the delta-sigma type AD converter 40a according to the fourth embodiment in that the sample-hold circuit 1 according to the first embodiment is applied to the first-stage integration circuit 50a of the delta-sigma type AD converter 40a and a next-stage integration circuit 50e performs double-sampling. Differences from the delta-sigma type AD converter 40a according to the fourth embodiment are explained below.

A circuit configuration example of the next-stage integration circuit 50e according to the sixth embodiment is explained with reference to FIGS. 14 and 15.

Figure 14:
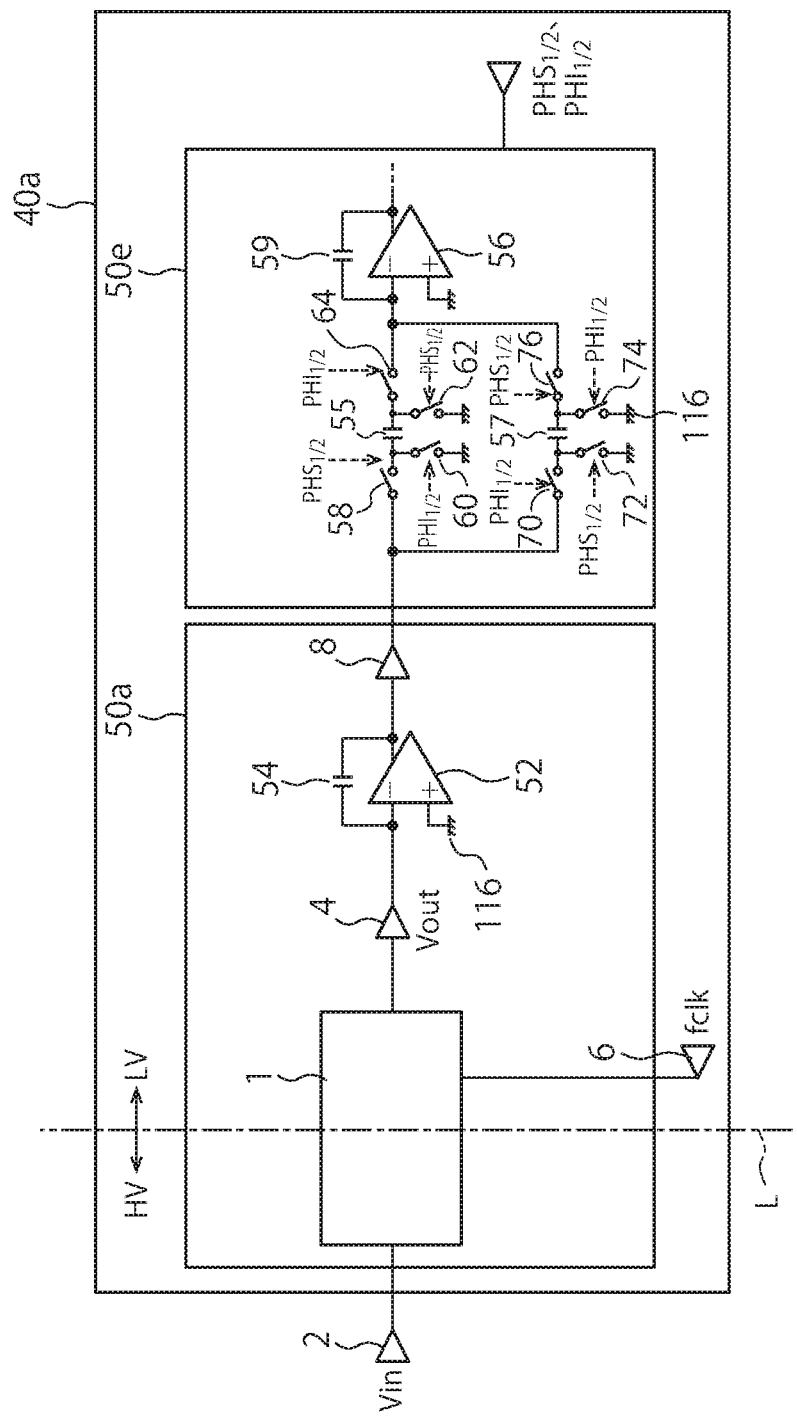
FIG. 14 is a diagram showing a circuit configuration example of a delta-sigma type AD converter according to a sixth embodiment.

FIG. 14 is a diagram showing a circuit configuration example of the delta-sigma type AD converter 40a according to the sixth embodiment.

Figure 15:
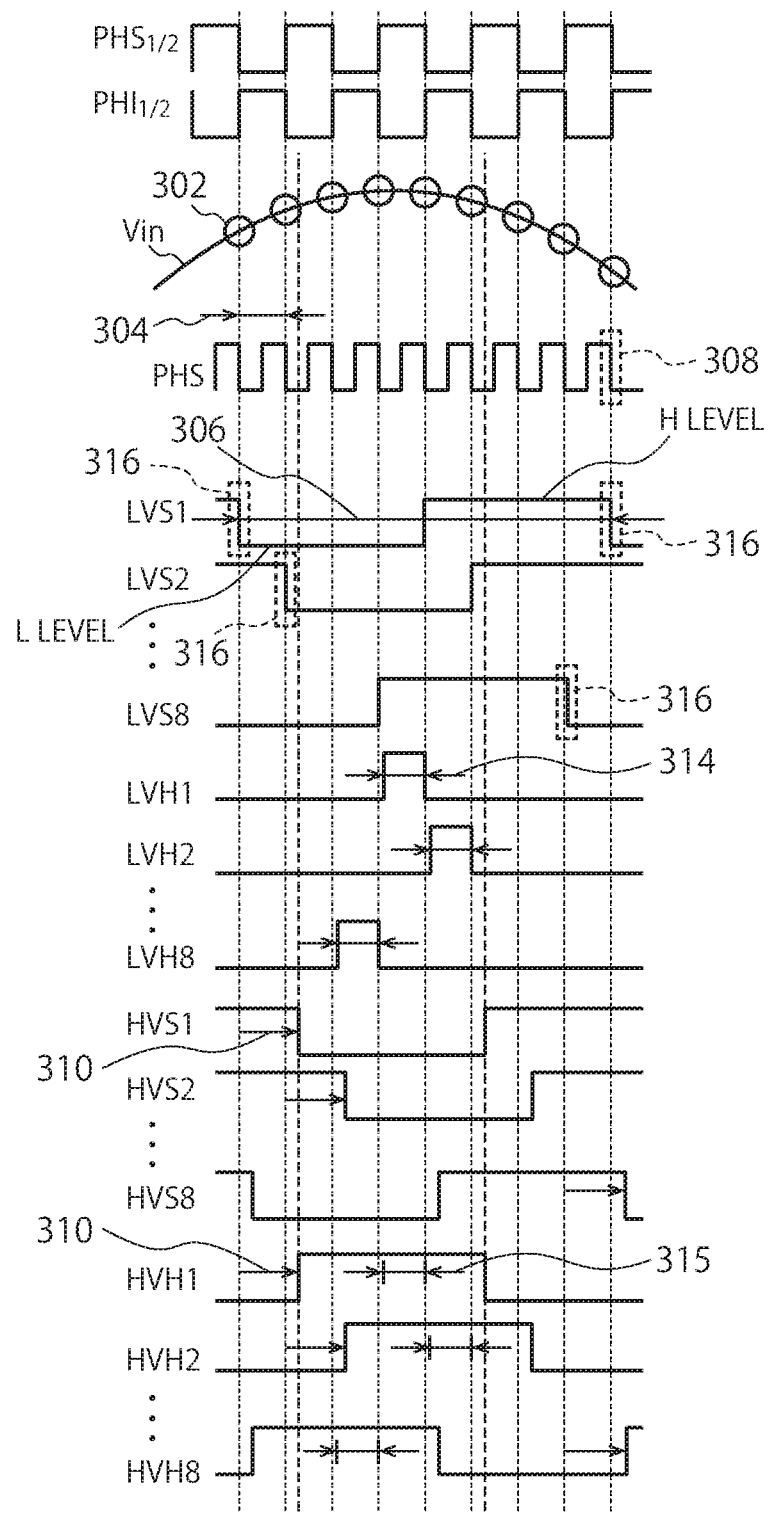
FIG. 15 is a diagram in which a signal $PHS_{1/2}$ and a signal $PHI_{1/2}$ are added to a time chart.

FIG. 15 is a diagram in which a signal $PHS_{1/2}$ and a signal $PHI_{1/2}$ are added to the time chart of the signals generated by the signal generation circuit 20 according to the first embodiment. The horizontal axis indicates an elapsed time. The vertical axes respectively indicate, from an upper stage, the signal $PHS_{1/2}$, the signal $PHI_{1/2}$, the input signal Vin, the first reference clock signal PHS on the second withstand voltage side, the third signals LVS1 to LVSn, the fourth signals LVH1 to LVHn, the first signals HVS1 to HVSn, and the second signals HVH1 to HVHn.

As shown in FIG. 14, the next-stage integration circuit 50e further includes a seventh capacitor 57 and forty-first to forty-fourth switch elements 70, 72, 74, and 76.

The seventh capacitor 57 is a capacitor for sample and hold. The forty-first to forty-fourth switch elements 70, 72, 74, and 76 are made up of, for example, MOS transistors. More specifically, one end of the forty-first switch element 70 is connected to the output terminal 8 of the operational amplifier 52.

The other end of the forty-first switch element 70 is connected to one end of the seventh capacitor 57. The forty-first switch element 70 comes into the conduction state or the cut-off state according to the signal $PHI_{1/2}$ (FIG. 15) output from the device having the second withstand voltage. The signal $PHS_{1/2}$ has a cycle twice as large as the cycle of the first reference clock signal PHS. The signal $PHI_{1/2}$ is an inverted and non-overlapping signal of the signal $PHS_{1/2}$.

One end of the forty-second switch element 72 is connected to the one end of the seventh capacitor 57. The other end of the forty-second switch element 72 is connected to the common mode voltage 114 of the device on the first withstand voltage side. The forty-second switch element 72 comes into the conduction state or the cut-off state according to the signal $PHS_{1/2}$ output from the device having the second withstand voltage.

One end of the forty-third switch element 74 is connected to the other end of the seventh capacitor 57. The other end of the forty-third switch element 74 is connected to the common mode voltage 116 of the device on the second withstand voltage side. The forty-third switch element 74 operates according to the signal $PHI_{1/2}$ output from the device having the second withstand voltage.

One end of the forty-fourth switch element 76 is connected to the other end of the seventh capacitor 57. The other end of the forty-fourth switch element 76 is connected to the inverted input terminal of the operational amplifier 56. The forty-fourth switch element 76 operates according to the signal $PHS_{1/2}$ output from the device having the second withstand voltage.

As it is seen from this, the fifth capacitor 55 carries out sampling and holding once in a time equivalent to two cycles of the data rate cycle 304 (FIG. 15). Similarly, the seventh capacitor 57 carries out sampling and holding once in a time equivalent to two cycles of the data rate cycle 304 (FIG. 15). A sampling period of the fifth capacitor 55 corresponds to a hold period of the seventh capacitor 57.

A hold period of the fifth capacitor 55 corresponds to a sampling period of the seventh capacitor 57. That is, one of the fifth capacitor 55 and the seventh capacitor 57 is always performing sampling of length equivalent to one cycle of the data rate cycle 304 (FIG. 15).

As explained above, according to this embodiment, the sample-hold circuit 1 is applied to the first-stage integration circuit 50a of the delta-sigma type AD converter 40a that performs the double-sampling. This makes it possible to synchronize the hold period 315 of the input signal at the first withstand voltage with the next-stage integration circuit 50e in which one of the fifth capacitor 55 and the seventh capacitor 57 always performs the sampling of the length equivalent to one cycle 304 of the data rate. It is possible to realize the delta-sigma type AD converter 40a that performs the double-sampling.

Seventh Embodiment

The incremental delta-sigma type AD converter 40b according to a seventh embodiment is different from the delta-sigma type AD converter 40a according to the sixth embodiment in that the incremental delta-sigma type AD converter 40b according to the seventh embodiment further includes the reset switches 54r and 59r in the negative feedback circuits of the operational amplifier 52 and the operational amplifier 56. Differences from the delta-sigma type AD converter 40a according to the sixth embodiment are explained below.

Figure 16:
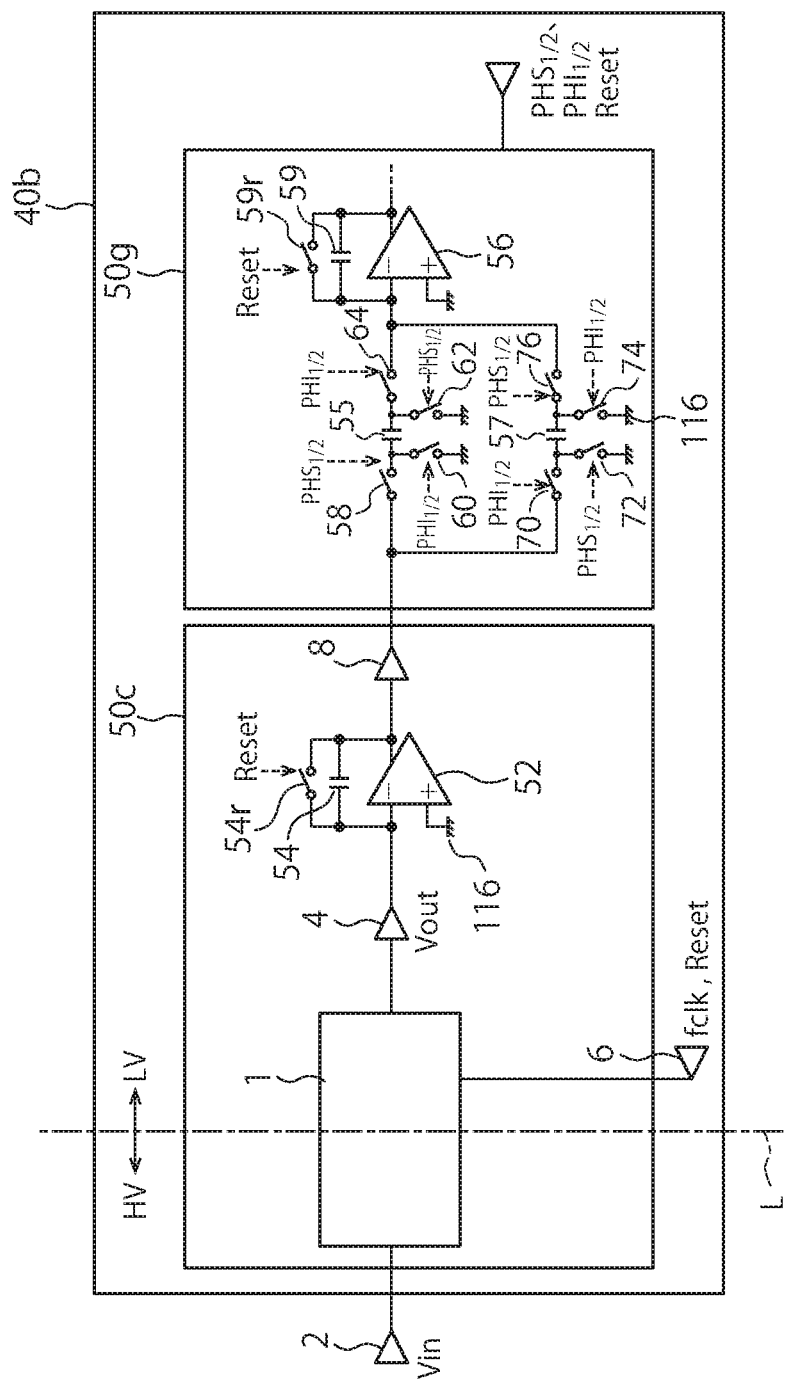
FIG. 16 is a diagram of a circuit configuration example of an incremental delta-sigma type AD converter according to a seventh embodiment.

FIG. 16 is a diagram showing a circuit configuration example of the incremental delta-sigma type AD converter 40b according to the seventh embodiment. The configuration of the reset switches 54r and 59r is equivalent to the configuration of the reset switches 54r and 59r of the delta-sigma type AD converter 40a according to the fifth embodiment. Therefore, explanation of the configuration is omitted.

As explained above, the first-stage integration circuit 50c is different from the first-stage integration circuit 50a according to the sixth embodiment in that the first-stage integration circuit 50c resets the fourth capacitor 54 at a cycle n times as large as the data rate cycle 304. Similarly, a next-stage integration circuit 50g is different from the next-stage integration circuit 50e according to the sixth embodiment in that the next-stage integration circuit 50g resets the sixth capacitor 59 at a cycle n times as large as the data rate cycle 304.

As explained above, according to this embodiment, the sample-hold circuit 1 is applied to the first-stage integration circuit 50c of the incremental delta-sigma type AD converter 40b that performs the double-sampling. This makes it possible to synchronize the hold period 315 of the input signal at the first withstand voltage with the next-stage integration circuit 50g in which one of the fifth capacitor 55 and the seventh capacitor 57 always performs the sampling of the length equivalent to one cycle of the data rate cycle 304 (FIG. 15) and reset the sixth capacitor 59 at a cycle n times as large as the data rate cycle 304. It is possible to realize the delta-sigma type AD converter 40a that performs the double-sampling.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A sample-hold circuit including a first device having a first withstand voltage and a second device having a second withstand voltage lower than the first withstand voltage, the sample-hold circuit comprising:
    a first switch element having the first withstand voltage, one end of which is connected to an input terminal, the first switch element being operable upon receiving a first signal output from the first device;
    a first capacitor for sample and hold, one end of which is connected to another terminal of the first switch element;
    a second switch element having the first withstand voltage, one end of which is connected to the one end of the first capacitor and another end of which is connected to a common mode voltage on a side of the first device, the second switch element being operable upon receiving a second signal output from the first device;
    a third switch element having the second withstand voltage, one end of which is connected to another end of the first capacitor and another end of which is connected to a common mode voltage on a side of the second device, the third switch element being operable upon receiving a third signal output from the second device;
    a fourth switch element having the second withstand voltage, one end of which is connected to the other end of the first capacitor and another end of which is connected to an output terminal, the fourth switch element being operable upon receiving a fourth signal output from the second device; and
    a signal generation circuit configured to generate the first and second signals by level-up shifting a clock signal input to the side of the second device or a signal based on the clock signal and generate the third and fourth signals based on the clock signal,
    wherein the signal generation circuit comprises:
    an up-shift circuit configured to level-up shift the clock signal or the signal based on the clock signal, an input side of the up-shift circuit being made up of the second device and an output side of the up-shift circuit being made up of the first device,
    wherein the second signal includes a second conduction period signal for maintaining the second switch element in a conduction state and the fourth signal includes a fourth conduction period signal for maintaining the fourth switch element in the conduction state, and
    for a clock delay of the second conduction period signal caused by a withstand voltage difference between an input and an output in the up-shift circuit, the signal generation circuit generates the fourth signal for causing a conduction period of the second switch element and a conduction period of the fourth switch element to overlap.

2. The sample-hold circuit according to claim 1, wherein the signal generation circuit further includes a down-shift circuit configured to level-down shift the second signal, and the signal generation circuit generates the fourth signal on the basis of a signal obtained by level-down shifting the second signal.

3. The sample-hold circuit according to claim 2, wherein the first signal includes a first conduction period signal for maintaining the first switch element in the conduction state and the third signal includes a third conduction period signal for maintaining the third switch element in the conduction state, and the signal generation circuit generates the third signal for causing a conduction period of the first switch element and a conduction period of the third switch element to overlap.

4. A sample-hold circuit including a first device having a first withstand voltage and a second device having a second withstand voltage lower than the first withstand voltage, the sample-hold circuit comprising:
- a first switch element having the first withstand voltage, one end of which is connected to an input terminal, the first switch element being operable upon receiving a first signal output from the first device;
- a first capacitor for sample and hold, one end of which is connected to another terminal of the first switch element;
- a second switch element having the first withstand voltage, one end of which is connected to the one end of the first capacitor and another end of which is connected to a common mode voltage on a side of the first device, the second switch element being operable upon receiving a second signal output from the first device;
- a third switch element having the second withstand voltage, one end of which is connected to another end of the first capacitor and another end of which is connected to a common mode voltage on a side of the second device, the third switch element being operable upon receiving a third signal output from the second device;
- a fourth switch element having the second withstand voltage, one end of which is connected to the other end of the first capacitor and another end of which is connected to an output terminal, the fourth switch element being operable upon receiving a fourth signal output from the second device; and
- a voltage suppression circuit configured to suppress an output voltage based on the first capacitor.

5. The sample-hold circuit according to claim 4, wherein the voltage suppression circuit includes a second capacitor, one end of which is connected to another end on the second device side of the first capacitor and another end of which is connected to the common mode voltage on the first device side, and the voltage suppression circuit suppresses a voltage applied to the third and fourth switch elements to a level of the second withstand voltage by distributing electric charges accumulated in the first capacitor to the second capacitor in a period in which the second switch element is in a conduction state and the first switch element, the third switch element, and the fourth switch element are in a cut-off state.

6. The sample-hold circuit according to claim 4, wherein the voltage suppression circuit is an operational amplifier, an inverted input terminal of which is connected to a terminal on an output side of the fourth switch element and a second output terminal of which is connected to the output terminal, the operational amplifier including a negative feedback, the voltage suppression circuit suppressing a voltage on an output side of the fourth switch element to a level of the second withstand voltage in a conduction state of the fourth switch element.

7. A sample-hold circuit including a first device having a first withstand voltage and a second device having a second withstand voltage lower than the first withstand voltage, the sample-hold circuit comprising:
- a first switch element having the first withstand voltage, one end of which is connected to an input terminal, the first switch element being operable upon receiving a first signal output from the first device;
- a first capacitor for sample and hold, one end of which is connected to another terminal of the first switch element;
- a second switch element having the first withstand voltage, one end of which is connected to the one end of the first capacitor and another end of which is connected to a common mode voltage on a side of the first device, the second switch element being operable upon receiving a second signal output from the first device;
- a third switch element having the second withstand voltage, one end of which is connected to another end of the first capacitor and another end of which is connected to a common mode voltage on a side of the second device, the third switch element being operable upon receiving a third signal output from the second device;
- a fourth switch element having the second withstand voltage, one end of which is connected to the other end of the first capacitor and another end of which is connected to an output terminal, the fourth switch element being operable upon receiving a fourth signal output from the second device; and
- a signal generation circuit configured to generate the first and second signals by level-up shifting a clock signal input to the side of the second device or a signal based on the clock signal and generate the third and fourth signals based on the clock signal, wherein the sample-hold circuit includes at least two or more circuits connected in parallel to the input terminal and the output terminal, the third signal includes a third conduction period signal for maintaining the third switch element in a conduction state, and the signal generation circuit generates end time of the third conduction period signal included in the third signal while shifting time according to a sampling timing of an input signal input to the input terminal, and outputs the end time of the third conduction period signal sequentially for each two or more circuits.

8. An AD converter connected to the sample-hold circuit according to claim 7.

9. A delta-sigma type AD converter comprising the sample-hold circuit according to claim 7.

10. An incremental delta-sigma type AD converter comprising the sample-hold circuit according to claim 7.

11. A switched capacitor circuit comprising the sample-hold circuit according to claim 7.

* * * * *